(12) United States Patent
Hiratsuka et al.

(10) Patent No.: US 10,840,903 B2
(45) Date of Patent: Nov. 17, 2020

(54) SEMICONDUCTOR MODULE

(71) Applicant: Kabushiki Kaisha Toshiba, Minato-ku (JP)

(72) Inventors: Daisuke Hiratsuka, Yokohama (JP); Nobuto Fujiwara, Hino (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/548,398

(22) Filed: Aug. 22, 2019

(65) Prior Publication Data
US 2020/0091910 A1  Mar. 19, 2020

(30) Foreign Application Priority Data
Sep. 14, 2018 (JP) .................. 2018-173119

(51) Int. Cl.
| | | |
|---|---|---|
| *H03K 17/687* | (2006.01) | |
| *H02M 1/32* | (2007.01) | |
| *H01L 29/866* | (2006.01) | |
| *G01R 31/26* | (2020.01) | |
| *H02M 7/537* | (2006.01) | |
| *H03K 17/08* | (2006.01) | |

(52) U.S. Cl.
CPC .......... *H03K 17/687* (2013.01); *G01R 31/26* (2013.01); *H01L 29/866* (2013.01); *H02M 1/32* (2013.01); *H02M 7/537* (2013.01); *H03K 17/08* (2013.01)

(58) Field of Classification Search
CPC ......... G01R 31/00; G01R 31/26; H01L 29/00; H01L 29/866; H02M 1/00; H02M 1/32; H02M 7/00; H02M 7/537; H03K 17/00; H03K 17/04123; H03K 17/063; H03K 17/08; H03K 17/0822; H03K 17/687; H03K 2217/00; H03K 2217/0036
USPC ........................................................ 327/427
See application file for complete search history.

(56) References Cited

U.S. PATENT DOCUMENTS

| | | | |
|---|---|---|---|
| 5,912,794 A | | 6/1999 | Ichikawa |
| 6,269,011 B1 * | | 7/2001 | Ohshima ................ H02H 3/087 323/908 |

(Continued)

FOREIGN PATENT DOCUMENTS

| | | |
|---|---|---|
| EP | 3 012 958 A1 | 4/2016 |
| JP | 9-70102 A | 3/1997 |

(Continued)

*Primary Examiner* — Lincoln D Donovan
*Assistant Examiner* — Dave Mattison
(74) *Attorney, Agent, or Firm* — Oblon, McClelland, Maier & Neustadt, L.L.P.

(57) ABSTRACT

A semiconductor module according to embodiments includes a first external terminal, a second external terminal, a first semiconductor switch which is electrically connected between the first external terminal and the second external terminal and includes a first gate electrode, a second semiconductor switch which is electrically connected in parallel with the first semiconductor switch, between the first external terminal and the second external terminal, and includes a second gate electrode, a first fuse electrically connected between the first external terminal and the first semiconductor switch, and a second fuse electrically connected between the second external terminal and the first semiconductor switch.

11 Claims, 19 Drawing Sheets

(56) References Cited

U.S. PATENT DOCUMENTS

| | | | |
|---|---|---|---|
| 2001/0046143 A1* | 11/2001 | Bruckmann | H03K 17/0828 363/56.05 |
| 2007/0284664 A1 | 12/2007 | Okuda et al. | |
| 2009/0160476 A1 | 6/2009 | Omaru | |
| 2010/0253267 A1 | 10/2010 | Kitanaka | |
| 2011/0012543 A1 | 1/2011 | Takizawa et al. | |
| 2011/0248564 A1 | 10/2011 | Hida | |
| 2011/0248657 A1 | 10/2011 | Endoh | |
| 2012/0025873 A1 | 2/2012 | Abe | |
| 2012/0063180 A1 | 3/2012 | Mizuno | |
| 2012/0068645 A1 | 3/2012 | Tsuji | |
| 2012/0075753 A1 | 3/2012 | Watanabe et al. | |
| 2012/0086496 A1 | 4/2012 | Itou et al. | |
| 2012/0306464 A1* | 12/2012 | Hirler | H01L 27/088 323/282 |
| 2013/0062724 A1 | 3/2013 | Tokuyama et al. | |
| 2013/0343103 A1 | 12/2013 | Takizawa | |
| 2014/0098581 A1 | 4/2014 | Takizawa | |
| 2014/0218991 A1* | 8/2014 | Chen | H02M 7/537 363/131 |
| 2014/0247634 A1 | 9/2014 | Takizawa | |
| 2015/0003127 A1 | 1/2015 | Takizawa | |
| 2015/0008973 A1 | 1/2015 | Fukuta | |
| 2016/0036342 A1 | 2/2016 | Takubo | |
| 2016/0123644 A1 | 5/2016 | Yoshimi et al. | |
| 2016/0173020 A1 | 6/2016 | Kanekawa et al. | |

FOREIGN PATENT DOCUMENTS

| | | |
|---|---|---|
| JP | 9-238476 A | 9/1997 |
| JP | 9-289780 A | 11/1997 |
| JP | 2000-175435 A | 6/2000 |
| JP | 2002-78241 A | 3/2002 |
| JP | 3303104 B2 | 7/2002 |
| JP | 2002-281736 A | 9/2002 |
| JP | 2002-300785 A | 10/2002 |
| JP | 2003-219631 A | 7/2003 |
| JP | 3425835 B2 | 7/2003 |
| JP | 3512917 B2 | 3/2004 |
| JP | 2004-201410 A | 7/2004 |
| JP | 2004-215415 A | 7/2004 |
| JP | 3581858 B2 | 10/2004 |
| JP | 2005-110411 A | 4/2005 |
| JP | 2005-137045 A | 5/2005 |
| JP | 2005-287233 A | 10/2005 |
| JP | 2006-50865 A | 2/2006 |
| JP | 3770163 B2 | 4/2006 |
| JP | 2006-254520 A | 9/2006 |
| JP | 2007-252020 A | 9/2007 |
| JP | 2007-259685 A | 10/2007 |
| JP | 2007-312480 A | 11/2007 |
| JP | 2007-330043 A | 12/2007 |
| JP | 2008-11608 A | 1/2008 |
| JP | 2008-54375 A | 3/2008 |
| JP | 2008-141612 A | 6/2008 |
| JP | 4114474 B2 | 7/2008 |
| JP | 2008-236907 A | 10/2008 |
| JP | 4177392 B2 | 11/2008 |
| JP | 4178454 B2 | 11/2008 |
| JP | 2009-11043 A | 1/2009 |
| JP | 4207734 B2 | 1/2009 |
| JP | 4212694 B2 | 1/2009 |
| JP | 2009-65097 A | 3/2009 |
| JP | 4244005 B2 | 3/2009 |
| JP | 4252109 B2 | 4/2009 |
| JP | 2009-159671 A | 7/2009 |
| JP | 2009-165348 A | 7/2009 |
| JP | 4338721 B2 | 10/2009 |
| JP | 4366712 B2 | 11/2009 |
| JP | 4434510 B2 | 3/2010 |
| JP | 2010-98790 A | 4/2010 |
| JP | 4525631 B2 | 8/2010 |
| JP | 2010-200545 A | 9/2010 |
| JP | 2010-220470 A | 9/2010 |
| JP | 4538047 B2 | 9/2010 |
| JP | 2010-246262 A | 10/2010 |
| JP | 2010-283986 A | 12/2010 |
| JP | 2011-24369 A | 2/2011 |
| JP | 4659189 B2 | 3/2011 |
| JP | 4665561 B2 | 4/2011 |
| JP | 2011-97673 A | 5/2011 |
| JP | 4689530 B2 | 5/2011 |
| JP | 2011-182519 A | 9/2011 |
| JP | 2011-199940 A | 10/2011 |
| JP | 2011-216755 A | 10/2011 |
| JP | 2011-223707 A | 11/2011 |
| JP | 2011-250534 A | 12/2011 |
| JP | 2012-19614 A | 1/2012 |
| JP | 4872485 B2 | 2/2012 |
| JP | 4882710 B2 | 2/2012 |
| JP | 2012-55125 A | 3/2012 |
| JP | 2012-70261 A | 4/2012 |
| JP | 2012-70262 A | 4/2012 |
| JP | 2012-84970 A | 4/2012 |
| JP | 2012-85513 A | 4/2012 |
| JP | 2012-95046 A | 5/2012 |
| JP | 2012-100489 A | 5/2012 |
| JP | 2012-105088 A | 5/2012 |
| JP | 4930866 B2 | 5/2012 |
| JP | 4946103 B2 | 6/2012 |
| JP | 2012-165618 A | 8/2012 |
| JP | 2012-186937 A | 9/2012 |
| JP | 5034800 B2 | 9/2012 |
| JP | 2012-200035 A | 10/2012 |
| JP | 2012-244747 A | 12/2012 |
| JP | 2013-27260 A | 2/2013 |
| JP | 2013-38864 A | 2/2013 |
| JP | 5146786 B2 | 2/2013 |
| JP | 2013-55848 A | 3/2013 |
| JP | 5168307 B2 | 3/2013 |
| JP | 2013-85325 A | 5/2013 |
| JP | 2013-101993 A | 5/2013 |
| JP | 2013-102694 A | 5/2013 |
| JP | 5201245 B2 | 6/2013 |
| JP | 5201268 B2 | 6/2013 |
| JP | 5206757 B2 | 6/2013 |
| JP | 5251413 B2 | 7/2013 |
| JP | 5268294 B2 | 8/2013 |
| JP | 5294950 B2 | 9/2013 |
| JP | 5320351 B2 | 10/2013 |
| JP | 5326655 B2 | 10/2013 |
| JP | 5343675 132 | 11/2013 |
| JP | 5354277 B2 | 11/2013 |
| JP | 2013-258862 A | 12/2013 |
| JP | 5359637 B2 | 12/2013 |
| JP | 5404310 B2 | 1/2014 |
| JP | 5447983 B2 | 3/2014 |
| JP | 2014-79037 A | 5/2014 |
| JP | 2014-82809 A | 5/2014 |
| JP | 5489586 B2 | 5/2014 |
| JP | 5533493 B2 | 6/2014 |
| JP | 5533555 B2 | 6/2014 |
| JP | 5561197 B2 | 7/2014 |
| JP | 2014-192950 A | 10/2014 |
| JP | 5599757 B2 | 10/2014 |
| JP | 5618595 B2 | 11/2014 |
| JP | 2014-236530 A | 12/2014 |
| JP | 2014-236580 A | 12/2014 |
| JP | 5645425 B2 | 12/2014 |
| JP | 2015-6015 A | 1/2015 |
| JP | 2015-12621 A | 1/2015 |
| JP | 2015-15817 A | 1/2015 |
| JP | 5660404 B2 | 1/2015 |
| JP | 2015-023709 A | 2/2015 |
| JP | 2015-29397 A | 2/2015 |
| JP | 2015-33212 A | 2/2015 |
| JP | 5664350 B2 | 2/2015 |
| JP | 5665952 B1 | 2/2015 |
| JP | 5671950 B2 | 2/2015 |
| JP | 5676919 B2 | 2/2015 |
| JP | 2015-65753 A | 4/2015 |
| JP | 2015-104233 A | 6/2015 |
| JP | 2015-130743 A | 7/2015 |

(56) References Cited

FOREIGN PATENT DOCUMENTS

| | | | |
|---|---|---|---|
| JP | 2015-142462 | A | 8/2015 |
| JP | 2015-162999 | A | 9/2015 |
| JP | 5774946 | B2 | 9/2015 |
| JP | 5786392 | B2 | 9/2015 |
| JP | 5787127 | B2 | 9/2015 |
| JP | 5849586 | B2 | 1/2016 |
| JP | 2018-11467 | A | 1/2018 |
| JP | 2018-148164 | A | 9/2018 |
| JP | 2018-181513 | A | 11/2018 |
| JP | 2019-109978 | A | 7/2019 |
| WO | WO 2009/087775 | A1 | 7/2009 |
| WO | WO 2011/024591 | A1 | 3/2011 |

* cited by examiner

SEMICONDUCTOR MODULE

CROSS-REFERENCE TO RELATED APPLICATION

This application is based upon and claims the benefit of priority from Japanese Patent Application No. 2018-173119, filed on Sep. 14, 2018, the entire contents of which are incorporated herein by reference.

FIELD

Embodiments described herein relate generally to a semiconductor module.

BACKGROUND

A power module includes a plurality of semiconductor switching elements mounted on a substrate, for example.

In a power module including a plurality of semiconductor switching elements, in a case where one semiconductor switching element is short-circuited and fails during operation, power control with a power module cannot be continued. Further, at a spot where a short-circuit failure is caused, a large quantity of heat is generated due to concentration of currents or occurrence of a persistent arc. For those reasons, a serious secondary disaster such as a fire may possibly be invited.

In order to prevent occurrence of a serious secondary disaster, a power apparatus such as an inverter circuit including a power module is provided with an overcurrent protection function in some cases. With an overcurrent protection function, when an abnormal current caused due to a short-circuit failure is detected, an operation of a power apparatus is stopped after a previously-set time period. By stopping an operation of a power apparatus, it is possible to reduce a risk of a secondary disaster. However, after an operation of a power apparatus is stopped, it becomes necessary to replace a power module and restart a power apparatus.

DETAILED DESCRIPTION

Figure 1:
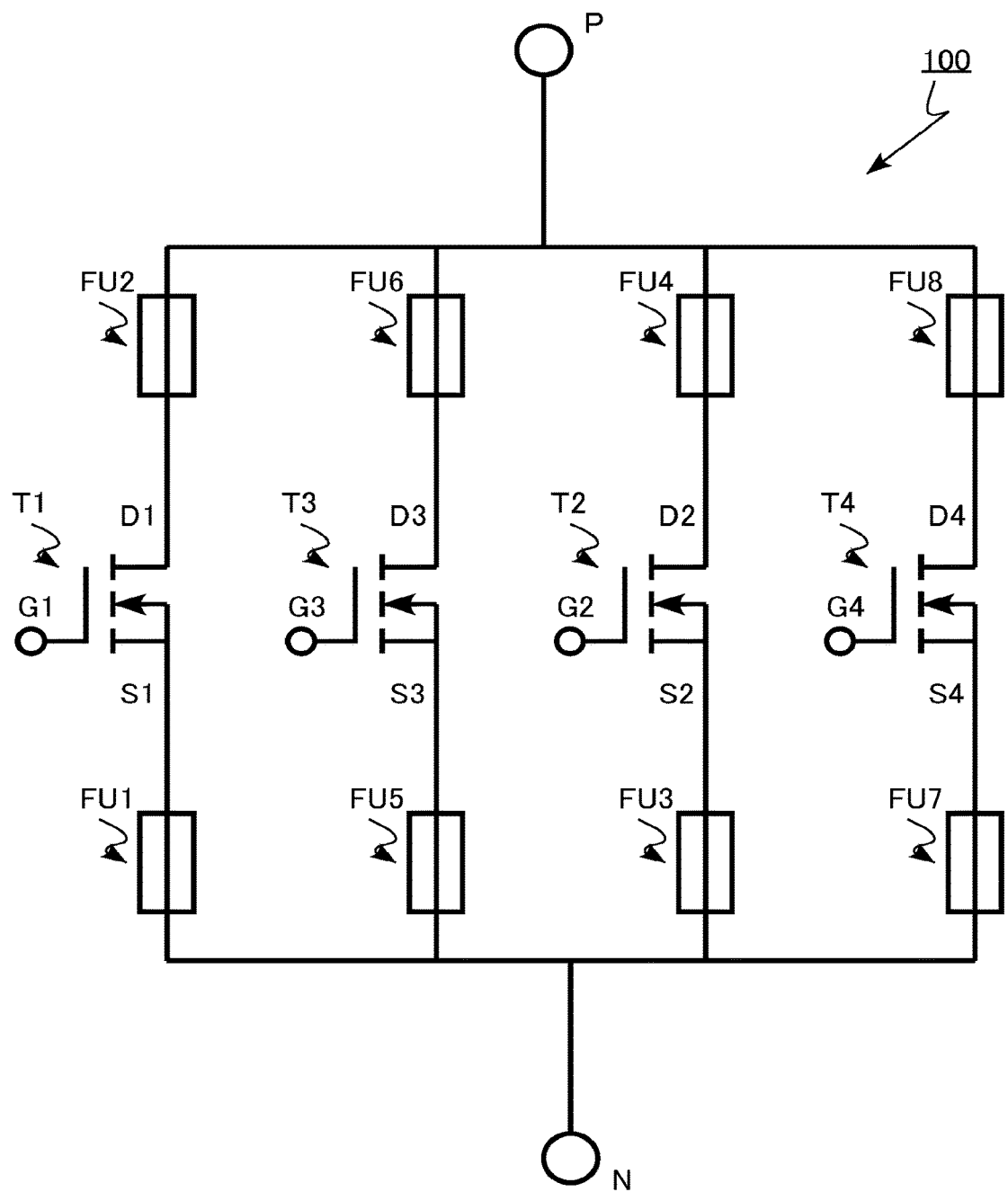
FIG. 1 is a diagram of an equivalent circuit of a semiconductor module according to a first embodiment.

A semiconductor module according to one aspect of the present disclosure includes a first external terminal, a second external terminal, a first semiconductor switch which is electrically connected between the first external terminal and the second external terminal and includes a first gate electrode, a second semiconductor switch which is electrically connected in parallel with the first semiconductor switch between the first external terminal and the second external terminal, and includes a second gate electrode, a first fuse electrically connected between the first external terminal and the first semiconductor switch, and a second fuse electrically connected between the second external terminal and the first semiconductor switch.

In the present specification, components which are the same or are similar to each other are denoted by the same reference signs, and duplicated description will be omitted in some portions.

In the present specification, in order to indicate a positional relationship between components or the like, an upward direction and a downward direction in the drawing will be described as "upper" and "lower", respectively, in some portions. In the present specification, concepts of "upper" and "lower" are not necessarily terms describing a relationship with a direction of gravity.

In the present specification, a "semiconductor module" means a semiconductor product in which a plurality of semiconductor elements are mounted in one package. A "semiconductor module" is a conceptual matter encompassing also an intelligent power module (IPM) in which a power semiconductor element, a driver circuit, and a control circuit are mounted in one package, for example.

First Embodiment

A semiconductor module according to a first embodiment includes a first external terminal, a second external terminal, a first semiconductor switch which is electrically connected between the first external terminal and the second external terminal and includes a first gate electrode, a second semiconductor switch which is electrically connected in parallel with the first semiconductor switch between the first external terminal and the second external terminal, and includes a second gate electrode, a first fuse electrically connected between the first external terminal and the first semiconductor switch, and a second fuse electrically connected between the second external terminal and the first semiconductor switch.

FIG. 1 is a diagram of an equivalent circuit of the semiconductor module according to the first embodiment.

The semiconductor module according to the first embodiment is a power module 100 in which a plurality of power semiconductor elements are mounted in one package. The power module 100 is used for an inverter designed to control high power, or the like, for example. A rated voltage of the power module 100 is equal to or higher than 250 V and equal to or lower than 10 kV, for example.

In the power module 100, as shown in FIG. 1, a transistor T1 (first semiconductor switching element, i.e. a first semiconductor switch), a transistor T2 (second semiconductor switching element, i.e. a second semiconductor switch), a transistor T3 (third semiconductor switching element, i.e. a third semiconductor switch), and a transistor T4 (fourth semiconductor switching element, i.e. a fourth semiconductor switch) are connected in parallel between a negative-pole terminal N (first external terminal) and a positive-pole terminal P (second external terminal). Each of the transistor T1, the transistor T2, the transistor T3, and the transistor T4 is a metal oxide field effect transistor (MOSFET), for example. A semiconductor switching element (semiconductor switch) may be an insulated gate bipolar transistor (IGBT) or a MOSFET.

The transistor T1 includes a source electrode S1, a drain electrode D1, and a gate electrode G1 (first gate electrode). The transistor T2 includes a source electrode S2, a drain electrode D2, and a gate electrode G2 (second gate electrode). The transistor T3 includes a source electrode S3, a drain electrode D3, and a gate electrode G3 (third gate electrode). The transistor T4 includes a source electrode S4, a drain electrode D4, and a gate electrode G4.

A fuse FU1 (first fuse) is electrically connected between the negative-pole terminal N and the transistor T1. One end of the fuse FU1 is electrically connected to the negative-pole terminal N, and the other end is electrically connected to the source electrode S1 of the transistor T1. A fuse FU2 (second fuse) is electrically connected between the positive-pole terminal P and the transistor T1. One end of the fuse FU2 is electrically connected to the positive-pole terminal P, and the other end is electrically connected to the drain electrode D1 of the transistor T1.

A fuse FU3 (third fuse) is electrically connected between the negative-pole terminal N and the transistor T2. One end of the fuse FU3 is electrically connected to the negative-pole terminal N, and the other end is electrically connected to the source electrode S2 of the transistor T2. A fuse FU4 (fourth fuse) is electrically connected between the positive-pole terminal P and the transistor T2. One end of the fuse FU4 is electrically connected to the positive-pole terminal P, and the other end is electrically connected to the drain electrode D2 of the transistor T2.

A fuse FU5 is electrically connected between the negative-pole terminal N and the transistor T3. One end of the fuse FU5 is electrically connected to the negative-pole terminal N, and the other end is electrically connected to the source electrode S3 of the transistor T3. A fuse FU6 is electrically connected between the positive-pole terminal P and the transistor T3. One end of the fuse FU6 is electrically connected to the positive-pole terminal P, and the other end is electrically connected to the drain electrode D3 of the transistor T3.

A fuse FU7 is electrically connected between the negative-pole terminal N and the transistor T4. One end of the fuse FU7 is electrically connected to the negative-pole terminal N, and the other end is electrically connected to the source electrode S4 of the transistor T4. A fuse FU8 is electrically connected between the positive-pole terminal P and the transistor T4. One end of the fuse FU8 is electrically connected to the positive-pole terminal P, and the other end is electrically connected to the drain electrode D4 of the transistor T4.

Figure 2:
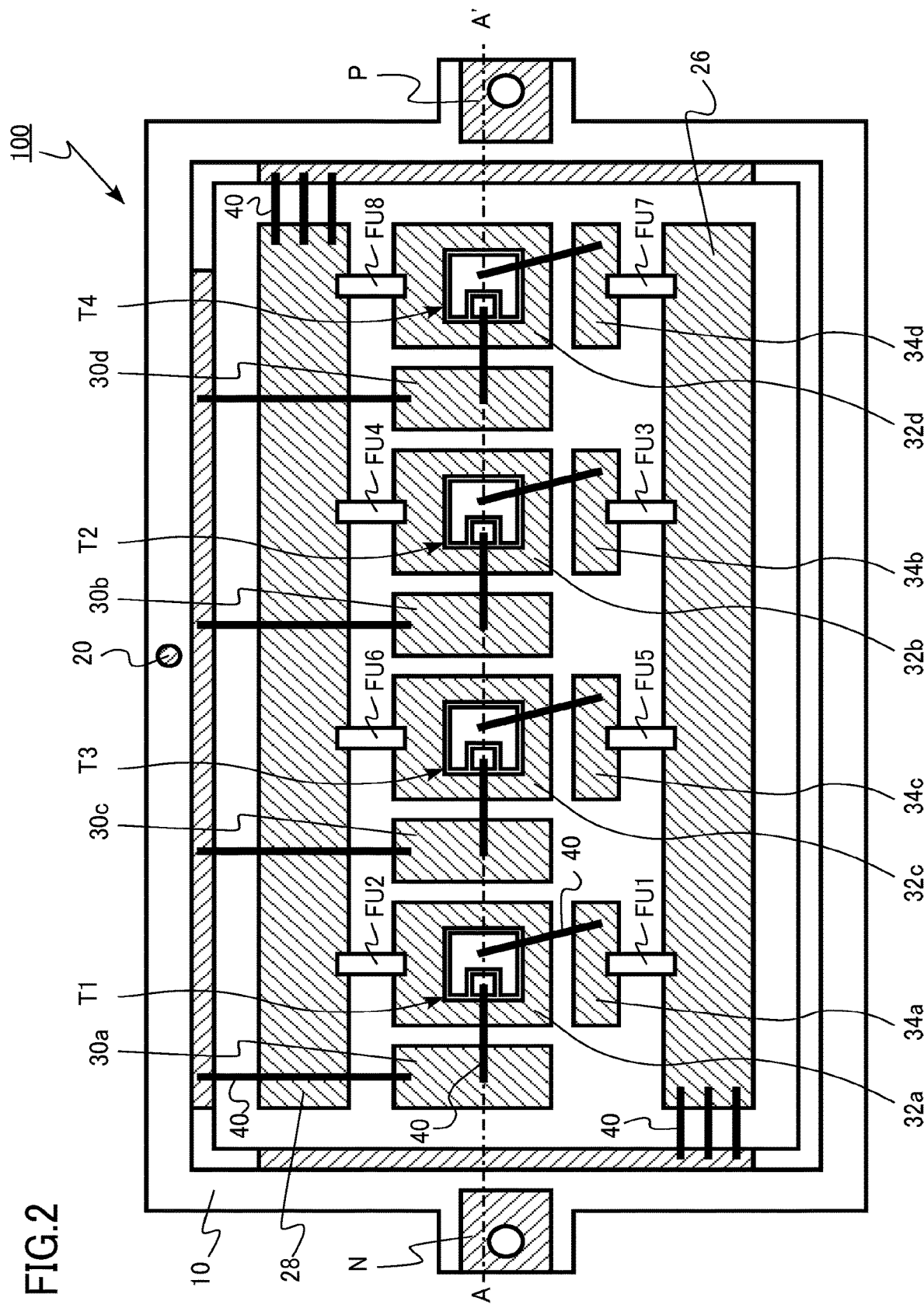
FIG. 2 is a schematic top view of the semiconductor module according to the first embodiment.
Figure 3:
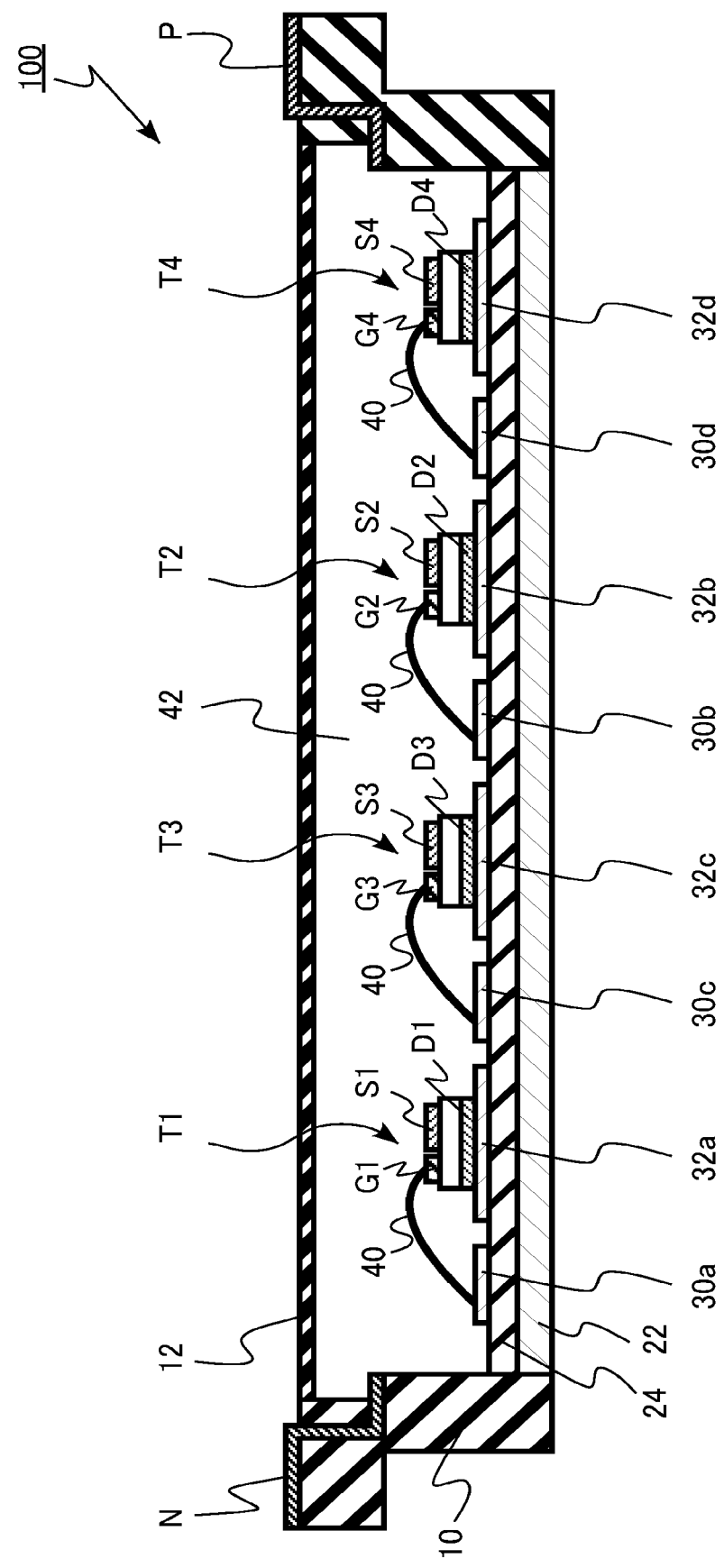
FIG. 3 is a schematic sectional view of the semiconductor module according to the first embodiment.

FIG. 2 is a schematic top view of the semiconductor module according to the first embodiment. FIG. 3 is a schematic sectional view of the semiconductor module according to the first embodiment. FIG. 3 shows a section taken along a line A-A' in FIG. 2.

The power module 100 includes a resin case 10, a lid 12, a gate terminal 20, a metal substrate 22, a resin insulating layer 24, a source wiring metal layer 26, a drain wiring metal layer 28, gate wiring metal layers 30a to 30d, drain connection metal layers 32a to 32d, source connection metal layers 34a to 34d, a bonding wire 40, and a silicone gel 42 (sealing material).

FIG. 2 is a top view of the power module 100 in a state where the lid 12 and the silicone gel 42 are removed.

The transistors T1 to T4 are vertical MOSFETs, for example. The transistors T1 to T4 are semiconductor chips using silicon carbide (SiC) or silicon (Si), for example.

In respective upper portions of the transistors T1 to T4, the source electrodes S1 to S4 and the gate electrodes G1 to G4 are provided. In respective lower portions of the transistors T1 to T4, the drain electrodes D1 to D4 are provided. For example, in the transistor T1, the source electrode S1 and the gate electrode G1 are provided in an upper portion and the drain electrode D1 is provided in a lower portion.

The metal substrate 22 is copper, for example. When the power module 100 is mounted in a power apparatus, a heat dissipation plate not shown in the drawing is connected to a back surface of the metal substrate 22, for example.

The resin case 10 is provided around the metal substrate 22. The lid 12 is provided on the resin case 10. Also, the inside of the power module 100 is filled with the silicone gel 42 as a sealing material. The resin case 10, the metal substrate 22, the lid 12, and the silicone gel 42 have functions of protecting or insulating components in the power module 100.

In an upper portion of the resin case 10, the negative-pole terminal N, the positive-pole terminal P, and the gate terminal 20 are provided. A negative voltage, for example, is externally applied to the negative-pole terminal N. A ground potential, for example, is applied to the negative-pole terminal N. A positive voltage, for example, is externally applied to the positive-pole terminal P.

The resin insulating layer 24 is provided on the metal substrate 22. The resin insulating layer 24 has a function of insulating the metal substrate 22, the source wiring metal layer 26, the drain wiring metal layer 28, the gate wiring metal layers 30a to 30d, the drain connection metal layers 32a to 32d, and the source connection metal layers 34a to 34d. A resin in the resin insulating layer 24 contains a filler which is formed of boron nitride, for example, and has high thermal conductivity.

The source wiring metal layer 26, the drain wiring metal layer 28, the gate wiring metal layers 30a to 30d, the drain connection metal layers 32a to 32d, and the source connection metal layers 34a to 34d are provided on the resin insulating layer 24. The source wiring metal layer 26, the drain wiring metal layer 28, the gate wiring metal layers 30a to 30d, the drain connection metal layers 32a to 32d, and the source connection metal layers 34a to 34d are provided in nearly the same surface. The source wiring metal layer 26, the drain wiring metal layer 28, the gate wiring metal layers 30a to 30d, the drain connection metal layers 32a to 32d, and the source connection metal layers 34a to 34d are copper, for example.

The source wiring metal layer 26, the drain wiring metal layer 28, the drain connection metal layers 32a to 32d, and the source connection metal layers 34a to 34d have functions of electrically connecting the transistors T1 to T4 to the negative-pole terminal N or the positive-pole terminal P, for example. The gate wiring metal layers 30a to 30d have functions of connecting the transistors T1 to T4 to the gate terminal 20, for example.

The transistors T1 to T4 are provided on the drain connection metal layers 32a to 32d, respectively. The drain electrodes D1 to D4 of the transistors T1 to T4 are connected to the drain connection metal layers 32a to 32d using solder or Ag nanoparticles, for example.

The source electrodes S1 to S4 are connected to the source connection metal layers 34a to 34d using the bonding wire 40. The gate electrodes G1 to G4 are connected to the gate wiring metal layers 30a to 30d using the bonding wire 40.

One ends of the fuses FU1, FU3, FU5, and FU7 are connected to the source wiring metal layer 26, and the other ends are connected to the source connection metal layers 34a to 34d. One ends of the fuse FU2, FU4, FU6, and FU8 are connected to the drain connection metal layers 32a to 32d, and the other ends are connected to the drain wiring metal layer 28.

The source wiring metal layer 26 is connected to the negative-pole terminal N using the bonding wire 40. The drain wiring metal layer 28 is connected to the positive-pole terminal P using the bonding wire 40.

The bonding wire 40 is a wire including aluminum or copper as a main ingredient, for example.

The transistors T1 to T4 and the fuses FU1 to FU8 are covered with the silicone gel 42.

Figure 4A:
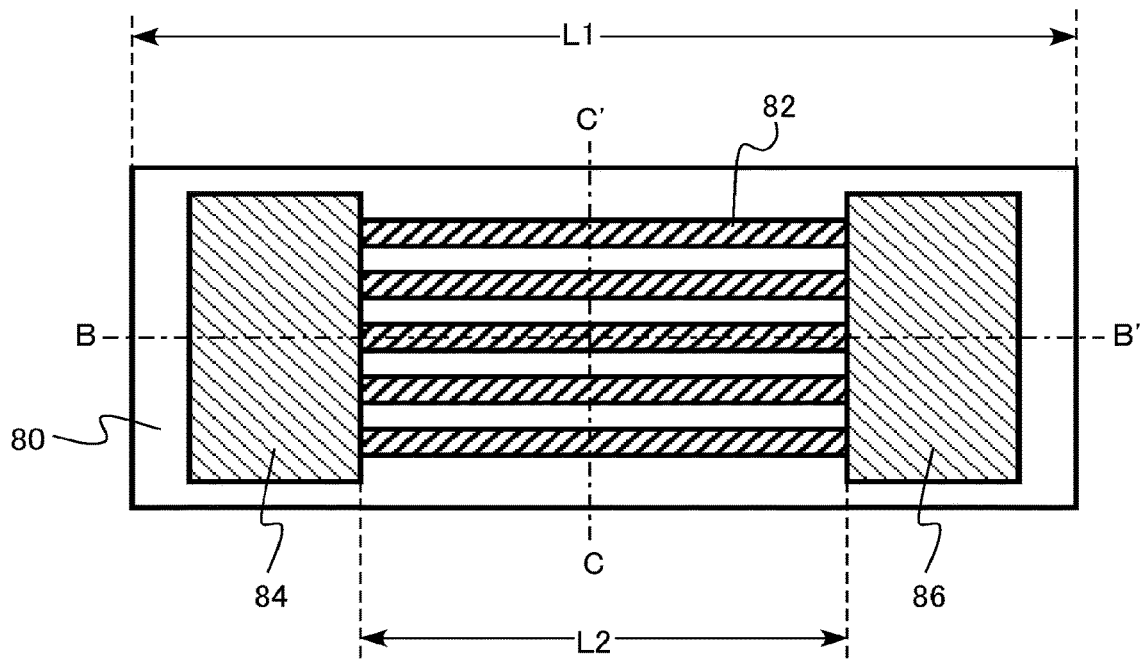
FIGS. 4A, 4B, and 4C are schematic views of a fuse according to the first embodiment.
Figure 4B:
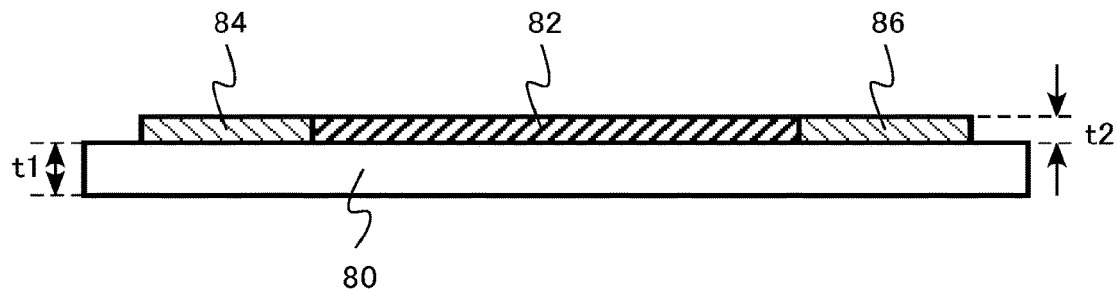
Figure 4C:
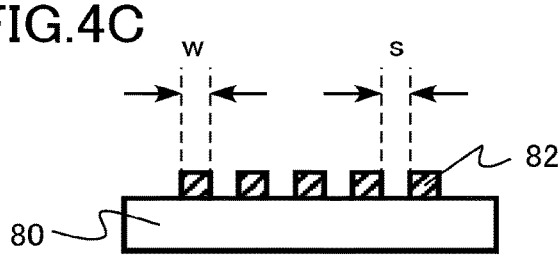

FIGS. 4A, 4B, and 4C are schematic views of the fuse according to the first embodiment. FIG. 4A is a top view, FIG. 4B is a sectional view taken along a line B-B' in FIG. 4A, and FIG. 4C is a sectional view taken along a line C-C' in FIG. 4A.

Each of the fuses FU1 to FU8 includes an insulating layer 80, a linear conductor 82, a first electrode pad 84, and a second electrode pad 86. The insulating layer 80 is one example of each of a first insulating layer and a second insulating layer. The linear conductor 82 is one example of each of a first linear conductor and a second linear conductor.

When a current having a predetermined value or larger flows in each of the fuses FU1 to FU8, the linear conductor 82 is cut because of Joule heat, so that electrical continuity at opposite ends of each of the fuses FU1 to FU8 is interrupted.

The insulating layer 80 is formed of a material having an insulating property. The insulating layer 80 functions as a supporting substrate for the linear conductor 82, the first electrode pad 84, and the second electrode pad 86.

The insulating layer 80 (first insulating layer) is glass or ceramic, for example. The insulating layer 80 is a resin such as an epoxy resin, a phenol resin, polyimide, or a fluorine-based resin, for example. A resin mixed with an insulating filler particle or an insulating fiber can be used for the insulating layer 80. An insulating filler particle is silica, alumina, or aluminum nitride, for example. Also, an insulating fiber is a glass fiber, for example.

A length L1 of the insulating layer 80 is equal to or larger than 1 mm and equal to or smaller than 20 mm, for example. A thickness t1 of the insulating layer 80 is equal to or larger than 0.1 mm and equal to or smaller than 1 mm, for example.

The linear conductor 82 is provided on the insulating layer 80. There are provided a plurality of linear conductors 82, for example. The linear conductors 82 are parallel with each other. FIG. 4A shows a case where five linear conductors 82 are provided, as an example. The number of the linear conductors 82 is not limited to five, and there may be provided a single linear conductor. Also, two, three, four, or six or more linear conductors may be provided.

The linear conductor 82 is formed of a material having conductivity. The linear conductor 82 is a metal, for example. The linear conductor 82 is a metal containing one of copper, copper alloy, aluminum, aluminum alloy, tin, zinc, bismuth, and nickel, as a main ingredient. The linear conductor 82 can be configured as a stacked structure including two kinds of metals, for example.

A length L2 of the linear conductor 82 is equal to or larger than 0.25 mm and equal to or smaller than 10 mm, for example. A thickness t2 of the linear conductor 82 is equal to or larger than 0.1 μm and equal to or smaller than 2 μm, for example.

A width w of the linear conductor 82 is equal to or larger than 10 μm and equal to or smaller than 1000 μm, for example. A space s between the linear conductors 82 is equal to or larger than 10 μm and equal to or smaller than 1000 μm, for example.

The first electrode pad 84 is provided at one end of the linear conductor 82, and the second electrode pad 86 is provided at the other end of the linear conductor 82. The first electrode pad 84 and the second electrode pad 86 are provided in such a manner that the linear conductor 82 is interposed. The first electrode pad 84 and the second electrode pad 86 are connected to the linear conductor 82. The first electrode pad 84 and the second electrode pad 86 have functions of applying a voltage across one end and the other end of the linear conductor 82.

The first electrode pad 84 and the second electrode pad 86 are formed of the same material as the linear conductor 82, for example.

A protective insulating film not shown in the drawing can be provided on the linear conductor 82. The protective insulating film is silicon oxide, silicon nitride, silicon oxynitride, or polyimide, for example.

The fuses FU1 to FU8 can be manufactured using a semiconductor manufacturing process, for example. A glass substrate, one example of the insulating layer 80, is prepared, for example. Then, a metal film is formed on the glass substrate by a sputtering process. The metal film is patterned using a lithography process or a reactive ion etching process, so that a plurality of linear conductors 82, the first electrode pad 84, and the second electrode pad 86 are formed.

Figure 5:
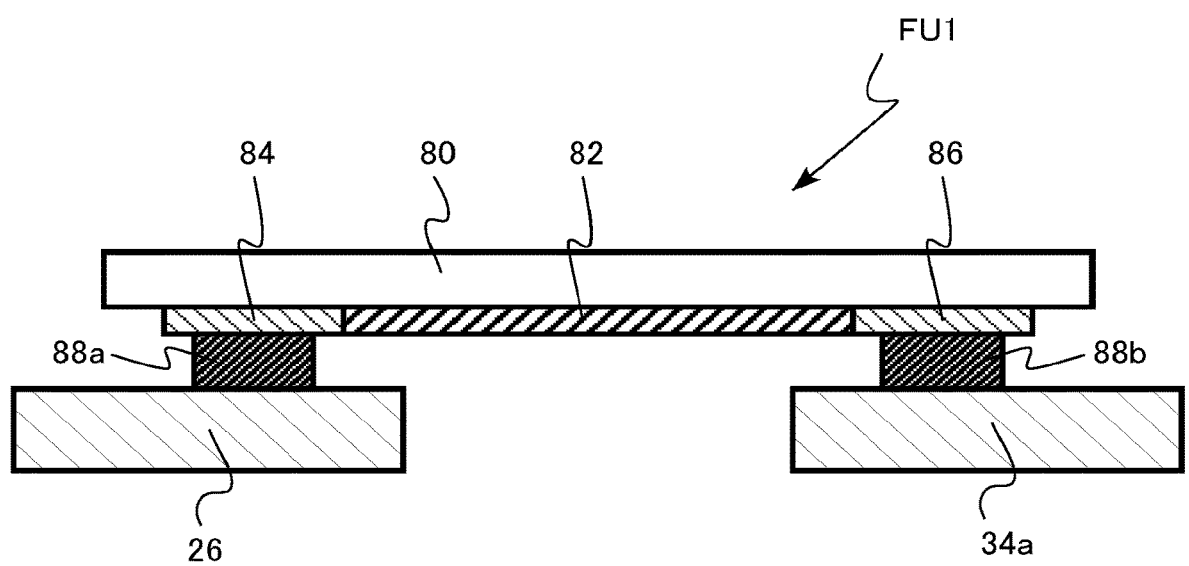
FIG. 5 is a schematic view of the fuse according to the first embodiment.

FIG. 5 is a schematic view of the fuse according to the first embodiment. FIG. 5 shows a state in which the fuse FU1 is mounted in the power module 100. The first electrode pad 84 of the fuse FU1 is connected to the source wiring metal layer 26 via a first adhesion layer 88a. The second electrode pad 86 of the fuse FU1 is connected to the source connection metal layer 34a via a second adhesion layer 88b. The first adhesion layer 88a and the second adhesion layer 88b are solder or Ag nanoparticles, for example.

Below, a function and an effect of the power module 100 according to the first embodiment will be described.

In a power module including a plurality of semiconductor switching elements (semiconductor switches), in a case where one semiconductor switching element (semiconductor switch) is short-circuited and fails during operation, power control cannot be continued. Further, at a spot where a short-circuit failure is caused, a large quantity of heat is generated due to concentration of currents or occurrence of a persistent arc. For those reasons, a serious secondary disaster such as a fire may possibly be invited.

In order to prevent occurrence of a serious secondary disaster, a power apparatus such as an inverter circuit including a power module is provided with an overcurrent protection function in some cases. With an overcurrent protection function, when an abnormal current caused due to a short-circuit failure is detected, an operation of a power apparatus is stopped after a previously-set time period. By stopping an operation of a power apparatus, it is possible to reduce a risk of a secondary disaster. However, after an operation of a power apparatus is stopped, it becomes necessary to replace a power module and restart a power apparatus.

Figure 6:
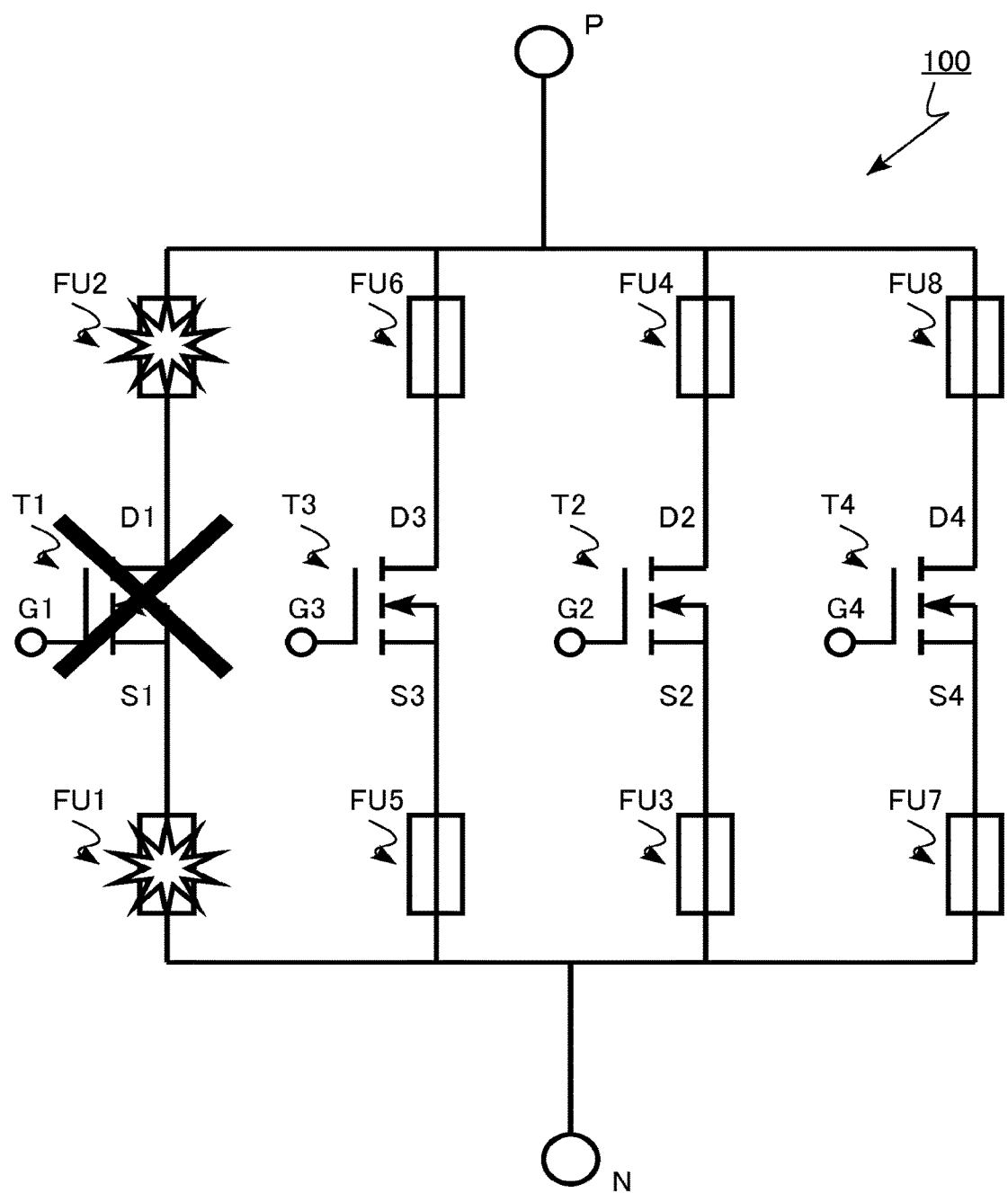
FIG. 6 is an explanatory view for a function and an effect of the semiconductor module according to the first embodiment.

FIG. 6 is an explanatory view for a function and an effect of the semiconductor module according to the first embodiment.

In the power module 100 according to the first embodiment, the transistor T1, for example, includes the fuse FU1 and FU2 in such a manner that the transistor T1 is interposed between the fuses. Consider a case where the transistor T1 is short-circuited and fails during operation of the power apparatus including the power module 100. In this case, a large current flows across the positive-pole terminal P and the negative-pole terminal N through the transistor T1 which is short-circuited and fails.

In such a case, a large current flows also in the fuse FU1 and the fuse FU2, and the linear conductor 82 of each of the fuse FU1 and the fuse FU2 is cut because of generated Joule heat. As a result of cutting of the linear conductor 82 of each of the fuse FU1 and the fuse FU2, a current flow through the transistor T1 is interrupted.

A current flow through the transistor T1 is interrupted before an overcurrent protection function of the power apparatus is performed, for example. An overcurrent protection function of the power apparatus is activated after a previously-set time period, to stop an operation of the power apparatus. It is general that a previously-set time period is approximately 10 μsec., for example.

The transistor T1 is separated from a circuit of the power module 100 by the fuse FU1 and the fuse FU2. Thus, the power module 100 is allowed to operate by the remaining transistors T2, T3, and T4. Accordingly, it is possible to continue exercising power control with the power module 100. This makes it possible to continue operating the power apparatus including the power module 100. Therefore, reliability of the power apparatus including the power module 100 is improved.

It is noted that in a case where the transistor T1 is short-circuited and fails, the fuse FU1 and the fuse FU2 are blown out at the same time. If one of the fuses is not blown out, a current flow between the gate electrode G1 and either the source electrode S1 or the drain electrode D1 in the transistor T1 is left.

The gate electrode G1 is electrically connected to the gate electrodes G2 to G4 of the other transistors, a driver circuit outside the power module 100, and the like, for example. Accordingly, if a current flow between the gate electrode G1 and either the source electrode S1 or the drain electrode D1 in the transistor T1 is left, it becomes difficult to continue exercising power control with the power module 100.

It is preferable that each of the fuses FU1 to FU8 included in the power module 100 has the following characteristics.

(First characteristic) To have a capability of accomplishing interruption quickly in 10 μsec. or shorter. To interrupt a current before an overcurrent protection function is activated, and make it possible to continue operating the power apparatus including the power module 100.

(Second characteristic) To prevent occurrence of a persistent arc at a time of blowout. To prevent the power module 100 from being damaged due to occurrence of a persistent arc.

(Third characteristic) To have a size equal to or smaller than a chip size of a semiconductor switching element. To prevent a size of the power module 100 from increasing due to mounting of a fuse.

(Fourth characteristic) To be blown out at the same time, in two fuses connected in series. To interrupt a current flow toward a gate electrode.

Figure 7:
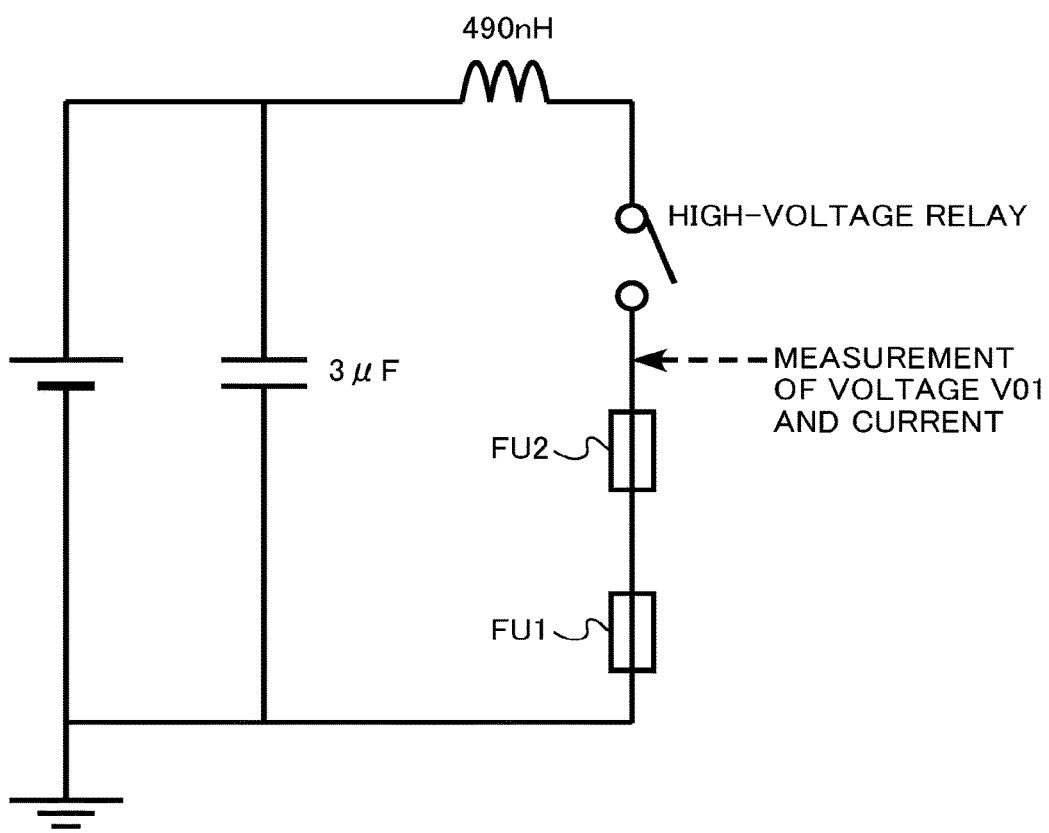
FIG. 7 is a diagram of an equivalent circuit of a test circuit in an example of experiment in the first embodiment.

FIG. 7 is a diagram of an equivalent circuit of a test circuit in an example of experiment in the first embodiment. The fuse FU1 and the fuse FU2 each having a configuration shown in FIGS. 4A to 4C were connected in series, and a current load experiment in which a short circuit was simulated by charge and discharge of a capacitor, was carried out.

In order to make a current flowing through each linear conductor when a power supply voltage is caused to vary between 1 and 3 kV, equal to 1 to 80 A per linear conductor, the number of the linear conductors 82 was set to one to ten, the thickness t2 of the linear conductor 82 was set to 0.35 μm, the width w of the linear conductor 82 was set to 3 to 850 μm, and the space s between the linear conductors 82 was set to 3 to 140 μm. The length L2 of the linear conductor 82 was caused to vary from 1 mm to 2 mm, 3 mm, and 5 mm. The linear conductor 82 was configured as a stacked structure including a titanium film and an aluminum film.

Figure 8A:
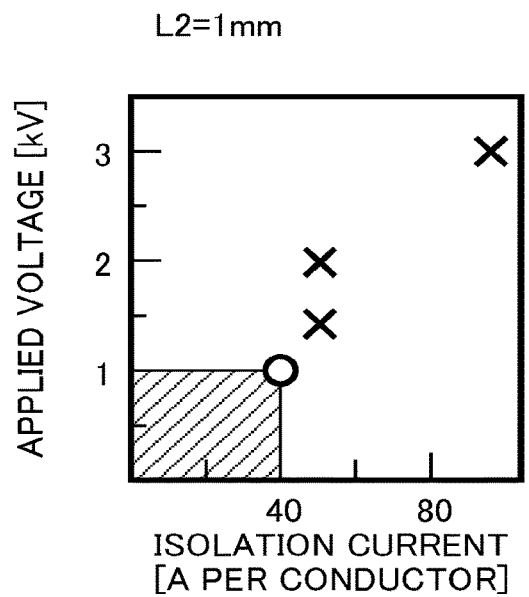
FIGS. 8A, 8B, 8C, and 8D are views showing results of a test in the example of experiment in the first embodiment.
Figure 8B:
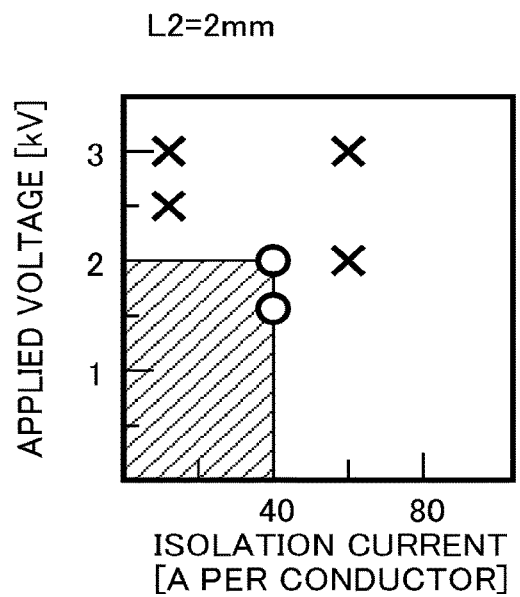
Figure 8C:
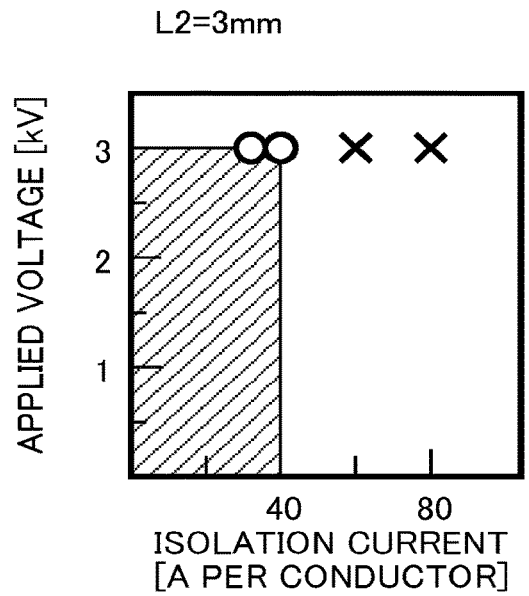
Figure 8D:
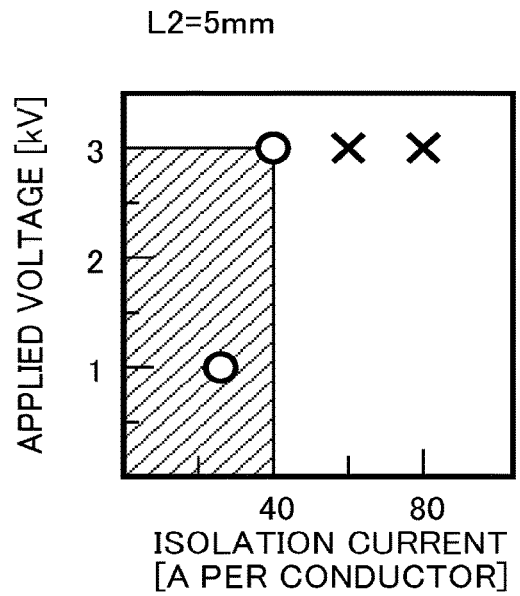

FIGS. 8A, 8B, 8C, and 8D are views showing results of a test in the example of experiment in the first embodiment. FIG. 8A shows a case where L2 is equal to 1 mm, FIG. 8B shows a case where L2 is equal to 2 mm, FIG. 8C shows a case where L2 is equal to 3 mm, and FIG. 8D shows a case where L2 is equal to 5 mm.

Shown are an applied voltage V01 applied to the fuse FU1 and the fuse FU2, a current (isolation current) per linear conductor 82, and occurrence or non-occurrence of a persistent arc. An instance in which a persistent arc does not occur is indicated by a sign of a white circle, and an instance in which a persistent arc occurs is indicated by a sign of a small cross. A hatched area is an area where a persistent arc does not occur at a time of blowout.

To set a current per linear conductor 82 to 40 A or smaller suppresses occurrence of a persistent arc. Also, to increase the length L2 of the linear conductor 82 results in an increase of the applied voltage V01 at which interruption can be accomplished without occurrence of a persistent arc. By setting the length L2 of the linear conductor 82 to 3 mm or larger, it is possible to accomplish blowout at the applied voltage V01 of up to 3 kV.

It is noted that under each of the forgoing conditions, interruption can be accomplished quickly in 10 μsec. or shorter. Also, under each of the foregoing conditions, the fuse FU1 and the fuse FU2 are cut at the same time. Further, the length L2 of the linear conductor 82 is equal to or smaller than 5 mm, so that a size equal to or smaller than a chips size of a semiconductor switching element is feasible.

The above-described example of experiment revealed that the above-described (first characteristic), (second characteristic), (third characteristic), and (fourth characteristic) could be attained by the fuse according to the first embodiment.

It is preferable that the length L2 of the linear conductor 82 is equal to or larger than 1 mm and equal to or smaller than 10 mm, and it is more preferable that the length L2 is equal to or larger than 3 mm and equal to or smaller than 5 mm. Within the above-described range, reduction of an applied voltage at which blowout can be accomplished can be made smaller. Also, within the above-described range, a size of a fuse can be further reduced.

It is preferable that the thickness t2 of the linear conductor 82 is equal to or larger than 0.1 µm and equal to or smaller than 2 µm, and it is more preferable that the thickness t2 is equal to or larger than 0.3 µm and equal to or smaller than 1.0 µm. Within the above-described range, a larger current can be caused to flow during normal operation. Also, within the above-described range, reduction of an applied voltage at which blowout can be accomplished can be made smaller.

It is preferable that the width w of the linear conductor 82 is equal to or larger than 10 µm and equal to or smaller than 1000 µm, and it is more preferable that the width w is equal to or larger than 20 µm and equal to or smaller than 200 µm. Within the above-described range, a larger current can be caused to flow during normal operation. Also, within the above-described range, reduction of an applied voltage at which blowout can be accomplished can be made smaller.

Also, it is preferable that each of the thickness t2 of the linear conductor 82 (first linear conductor) of the fuse FU1 and the thickness t2 of the linear conductor 82 (second linear conductor) of the fuse FU2 is equal to or larger than 0.1 µm and equal to or smaller than 1.3 µm, and that a difference between the thickness t2 of the linear conductor 82 (first linear conductor) of the fuse FU1 and the thickness t2 of the linear conductor 82 (second linear conductor) of the fuse FU2 is equal to or smaller than 0.3 µm. To set the thicknesses so as to fall within the above-described ranges makes it easy to blow out the fuse FU1 and the fuse FU2 at the same time.

It is preferable that a rated current of the power module 100 is equal to or smaller than a value obtained by multiplication of the number of the linear conductors 82 by 40 A. To satisfy the above-described condition suppresses occurrence of a persistent arc at a time of blowing out a fuse.

It is preferable that a material forming the linear conductor 82 is a metal which is apt to be converted into a metal oxide by thermal energy produced at a time of blowing out a fuse. By conversion into a metal oxide after blowout of a fuse, dielectric breakdown voltage is improved. From the foregoing viewpoint, it is preferable that a material forming the linear conductor 82 includes aluminum.

As described above, with the semiconductor module according to the first embodiment, it is possible to provide a semiconductor module which can continue operating even in a case where one semiconductor switching element is short-circuited and fails during operation. Accordingly, it is possible to continue operating the power apparatus including the semiconductor module according to the first embodiment. Therefore, reliability of the power apparatus including the semiconductor module according to the first embodiment is improved.

Second Embodiment

A semiconductor module according to a second embodiment is different from the semiconductor module according to the first embodiment in that an overvoltage protection element electrically connected between either a first external terminal or a second external terminal and a first gate electrode is further included. Below, description of details which are to be duplication of the first embodiment will be partly omitted.

Figure 9:
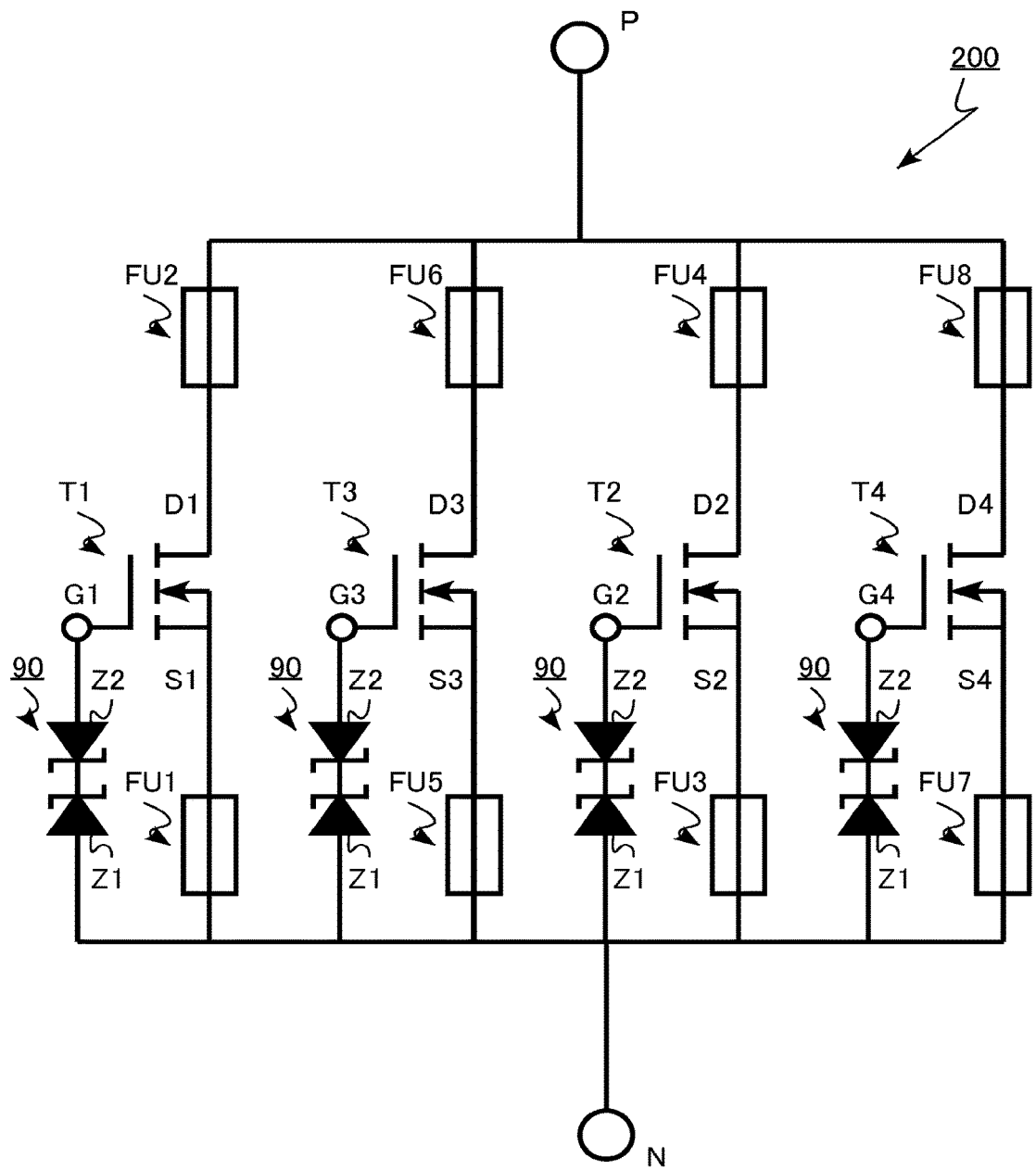
FIG. 9 is a diagram of an equivalent circuit of a semiconductor module according to a second embodiment.

FIG. 9 is a diagram of an equivalent circuit of the semiconductor module according to the second embodiment.

The semiconductor module according to the second embodiment is a power module 200 in which a plurality of power semiconductor elements are mounted in one package.

In the power module 200, overvoltage protection elements 90 are provided between a negative-pole terminal N and a gate electrode G1, between the negative-pole terminal N and a gate electrode G2, between the negative-pole terminal N and a gate electrode G3, and between the negative-pole terminal N and a gate electrode G4, respectively.

The overvoltage protection element 90 is an element in which a current-voltage characteristic is non-linear. The overvoltage protection element 90 is a two-terminal element in which resistance is reduced when an applied voltage exceeds a predetermined threshold voltage. The overvoltage protection element 90 has a function of causing a current to flow when an excessive voltage exceeding a predetermined threshold voltage is applied across two terminals. The overvoltage protection element 90 includes a first Zener diode Z1 and a second Zener diode Z2, for example.

The first Zener diode Z1 and the second Zener diode Z2 are connected in series while being oriented reversely with respect to each other. For example, a cathode of the first Zener diode Z1 is connected to a cathode of the second Zener diode Z2.

An anode of the first Zener diode Z1 is connected to the negative-pole terminal N. Also, an anode of the second Zener diode Z2 is connected to one of the gate electrode G1, the gate electrode G2, the gate electrode G3, and the gate electrode G4.

Figure 10:
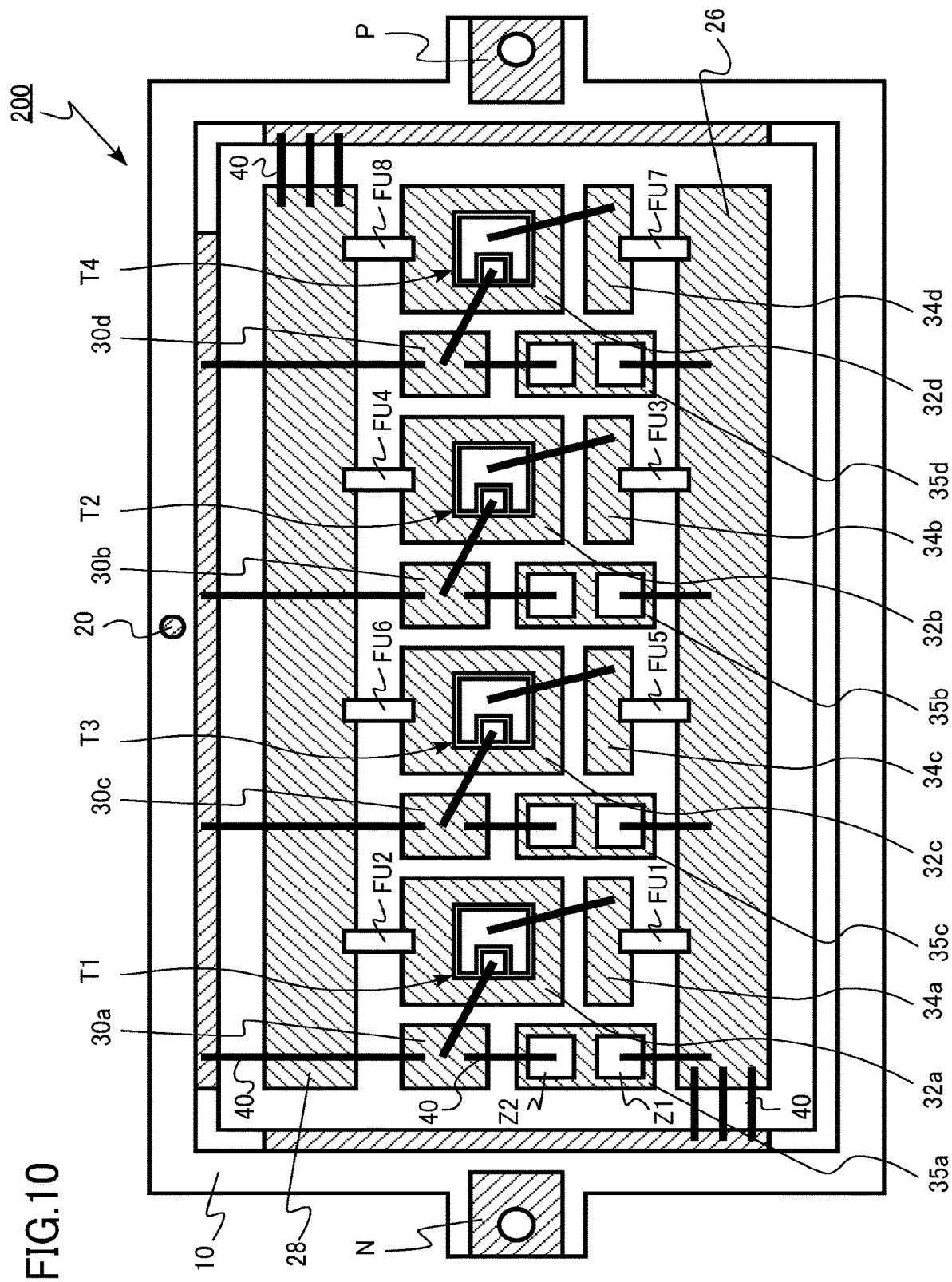
FIG. 10 is a schematic top view of the semiconductor module according to the second embodiment.

FIG. 10 is a schematic top view of the semiconductor module according to the second embodiment.

The power module 200 includes the negative-pole terminal N (first external terminal), a positive-pole terminal P (second external terminal), a transistor T1 (first semiconductor switching element, i.e. a first semiconductor switch), a transistor T2 (second semiconductor switching element, i.e. a second semiconductor switch), a transistor T3 (third semiconductor switching element, i.e. a third semiconductor switch), a transistor T4 (fourth semiconductor switching element, i.e. a fourth semiconductor switch), a fuse FU1 (first fuse), a fuse FU2 (second fuse), a fuse FU3 (third fuse), a fuse FU4 (fourth fuse), a fuse FU5, a fuse FU6, a fuse FU7, a fuse FU8, and four pairs each including the first Zener diode Z1 and the second Zener diode Z2.

The power module 200 includes a resin case 10, a lid 12, a gate terminal 20, a metal substrate 22, a resin insulating layer 24, a source wiring metal layer 26, a drain wiring metal layer 28, gate wiring metal layers 30a to 30d, drain connection metal layers 32a to 32d, source connection metal layers 34a to 34d, diode connection metal layers 35a to 35d, a bonding wire 40, and a silicone gel 42 (sealing material).

FIG. 10 is a top view of the power module 200 in a state where the lid 12 and the silicone gel 42 are removed.

The four pairs of the first Zener diodes Z1 and the second Zener diodes Z2 are provided on the diode connection metal layers 35a to 35d, respectively. The four pairs of the first Zener diodes Z1 and the second Zener diodes Z2 are connected to the diode connection metal layers 35a to 35d, respectively, using solder or Ag nanoparticles, for example.

Below, a function and an effect of the power module 200 according to the second embodiment will be described.

Figure 11:
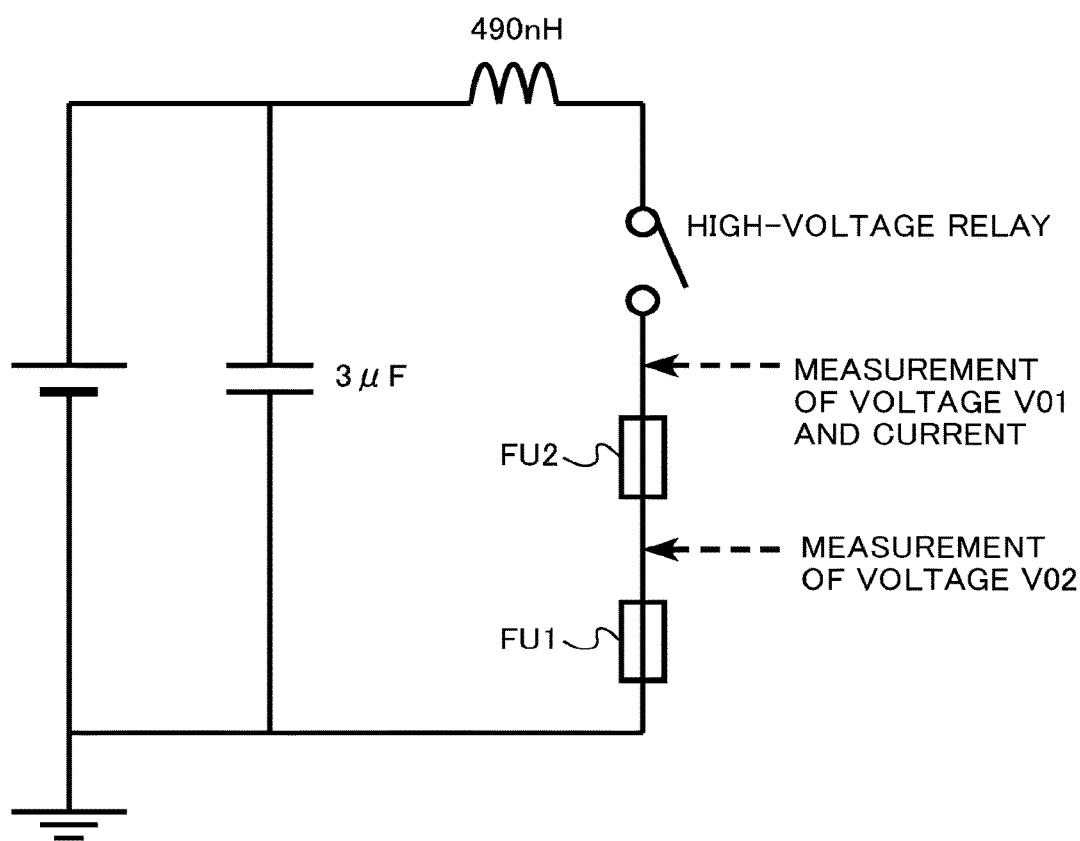
FIG. 11 is a diagram of an equivalent circuit of a test circuit in a first example of experiment in the second embodiment.

FIG. 11 is a diagram of an equivalent circuit of a test circuit in a first example of experiment in the second embodiment. The fuse FU1 and the fuse FU2 each having a configuration shown in FIGS. 4A to 4C were connected in series, and a current load experiment in which a short circuit was simulated by charge and discharge of a capacitor, was carried out.

A voltage V02 of a wire between the fuse FU1 and the fuse FU2 was measured. The voltage V02 of the wire between the fuse FU1 and the fuse FU2 represents a voltage of a gate electrode in a case where a transistor interposed between the fuse FU1 and the fuse FU2 is short-circuited in an equivalent circuit of the power module 100 in FIG. 1, in a simulated fashion.

Figure 12:
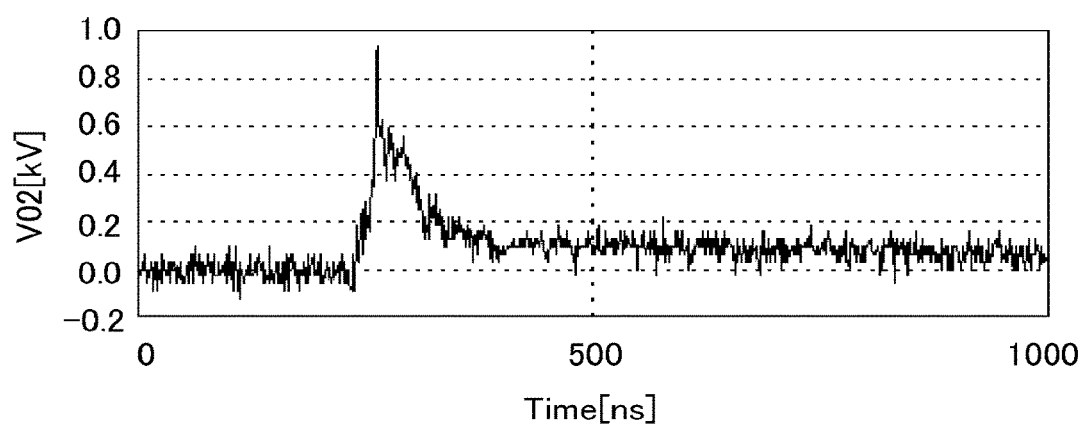
FIG. 12 is a view showing results of measurement in the first example of experiment in the second embodiment.

FIG. 12 is a view showing results of measurement in the first example of experiment in the second embodiment. FIG. 12 shows variation with time of the voltage V02.

In the circuit in FIG. 11, when a voltage is applied to the fuse FU1 and the fuse FU2, the fuse FU1 and the fuse FU2 are blown out at the same time. As shown in FIG. 12, the voltage V02 momentarily increases when the fuse FU1 and the fuse FU2 are blown out. In other words, a high voltage is momentarily applied across the fuse FU1 and the fuse FU2. It is considered that such application of high voltage is caused due to an induced current generated by inductance of a circuit after the fuse FU1 and the fuse FU2 are blown out.

Also in the equivalent circuit of the power module 100 in FIG. 1, a high voltage may possibly be momentarily applied to a gate electrode in a case where a transistor interposed between the fuse FU1 and the fuse FU2 is short-circuited. If a high voltage is momentarily applied to a gate electrode, there is a fear of breakage of a circuit or an element connected to the gate electrode of the transistor. For example, a gate driver circuit connected to the gate electrode, or a gate insulating film in contact with a gate electrode of another transistor connected to the gate electrode, may probably be broken.

Figure 13:
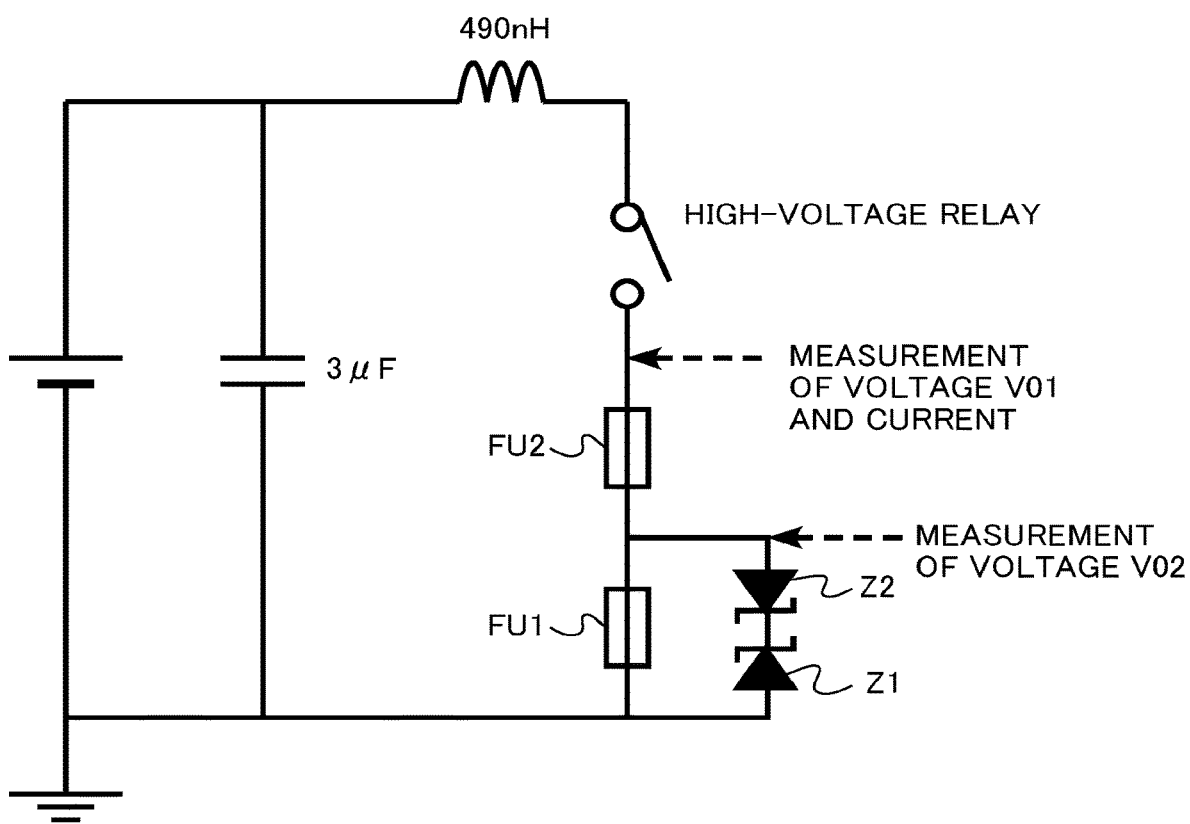
FIG. 13 is a diagram of an equivalent circuit of a test circuit in a second example of experiment in the second embodiment.

FIG. 13 is a diagram of an equivalent circuit of a test circuit in a second example of experiment in the second embodiment. In the circuit shown in FIG. 13, a wire which extends from between the fuse FU1 and the fuse FU2 and leads to a ground is provided in the circuit shown in FIG. 11. Then, the wire is connected to the first Zener diode Z1 and the second Zener diode Z2 in series in such a manner that the diodes are oriented reversely with respect to each other. The circuit shown in FIG. 13 is a result of simulating an equivalent circuit of the power module 200 according to the second embodiment.

Figure 14:
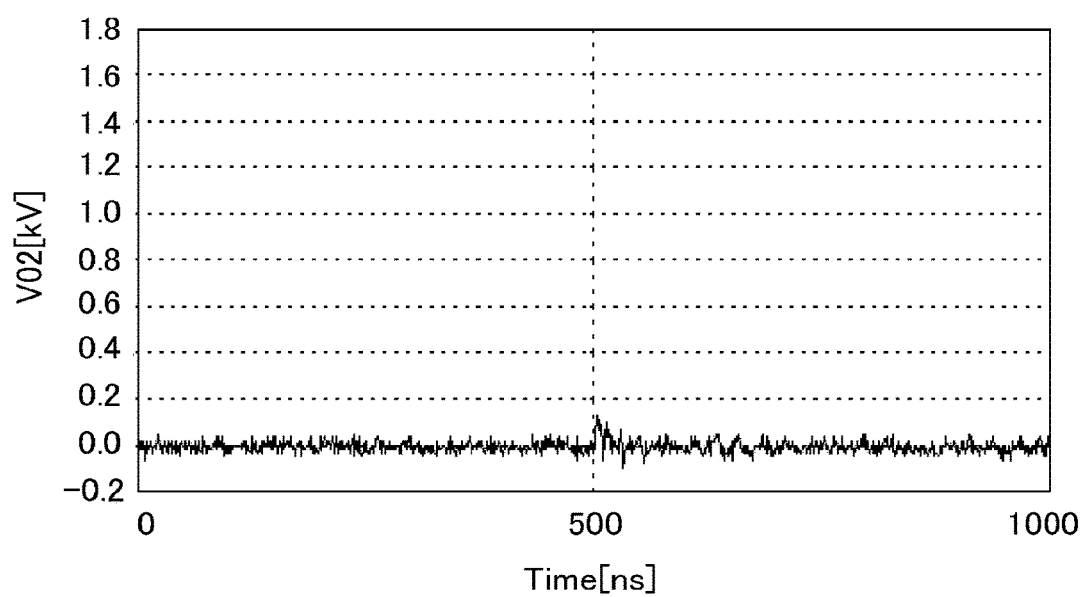
FIG. 14 is a view showing results of measurement in the second example of experiment in the second embodiment.

FIG. 14 is a view showing results of measurement in the second example of experiment in the second embodiment. FIG. 14 shows variation with time of the voltage V02.

A momentary increase of the voltage V02 like that seen in the circuit shown in FIG. 11 in which the first Zener diode Z1 and the second Zener diode Z2 are not included is not observed. It is considered that a current flows to a ground by virtue of the first Zener diode Z1 and the second Zener diode Z2, so that an increase of a voltage is suppressed.

It is noted that each of the first Zener diode Z1 and the second Zener diode Z2 keeps having high resistance until an applied voltage reaches a predetermined threshold voltage, and thus, a level of a gate voltage being applied to a gate electrode of a transistor during normal operation of the power module 200 is not affected.

With the power module 200 according to the second embodiment, in a case where a transistor is short-circuited, a circuit or an element connected to a gate electrode of the short-circuited transistor is prevented from being broken. Hence, it is possible to continue operating the power apparatus including the power module 200. Therefore, reliability of the power apparatus including the power module 200 is further improved.

(Modification)

A semiconductor module according to a modification of the second embodiment is different from that according to the second embodiment in that a varistor is included in place of the first Zener diode Z1 and the second Zener diode Z2.

Figure 15:
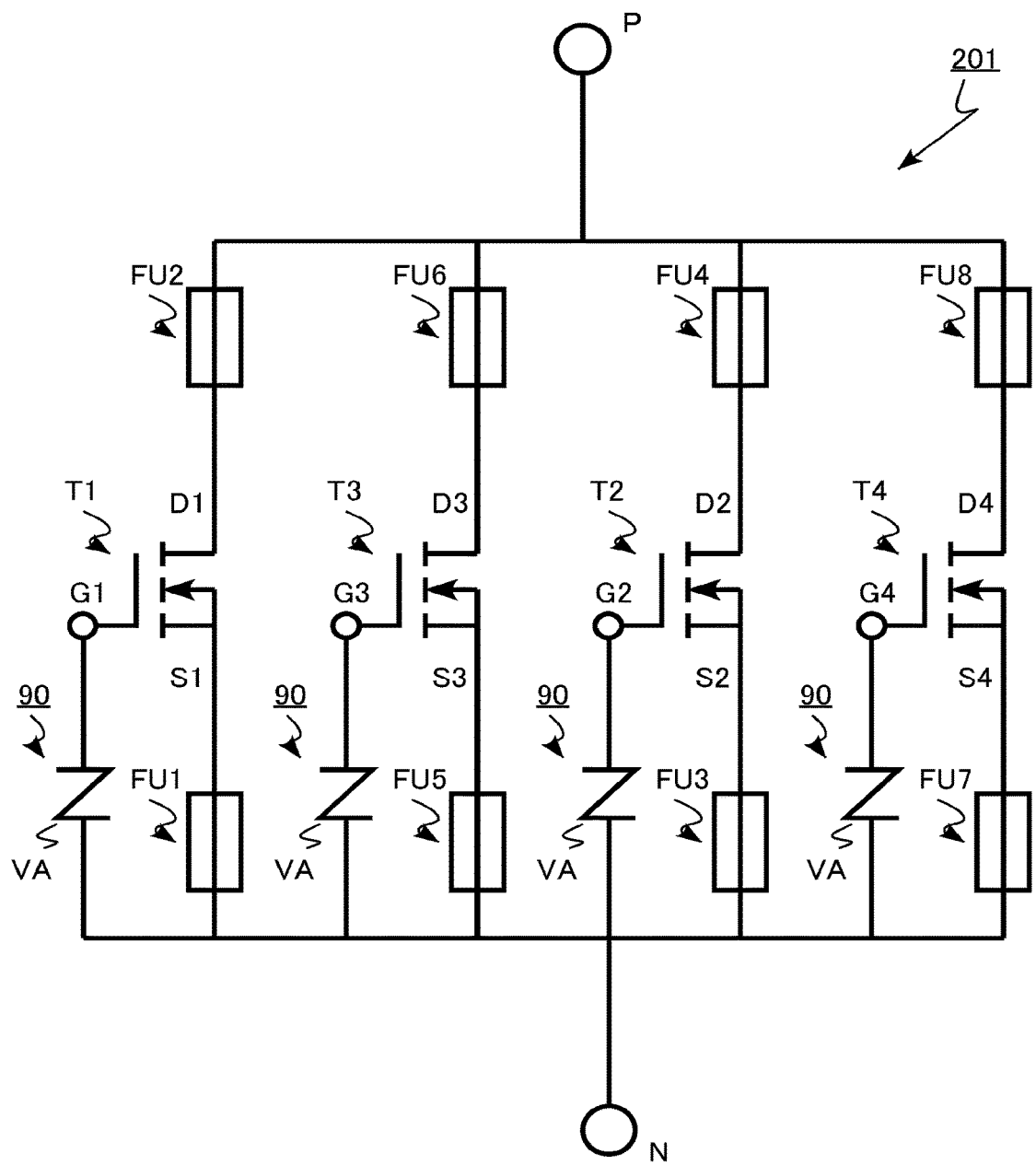
FIG. 15 is a diagram of an equivalent circuit of the semiconductor module according to a modification of the second embodiment.

FIG. 15 is a diagram of an equivalent circuit of the semiconductor module according to the modification of the second embodiment.

The semiconductor module according to the modification of the second embodiment is a power module 201 in which a plurality of power semiconductor elements are mounted in one package.

The power module 201 includes a varistor VA as the overvoltage protection element 90. In the power module 201, the varistors VA are provided as the overvoltage protection elements 90, between the negative-pole terminal N and the gate electrode G1, between the negative-pole terminal N and the gate electrode G2, between the negative-pole terminal N and the gate electrode G3, and between the negative-pole terminal N and the gate electrode G4, respectively.

Figure 16:
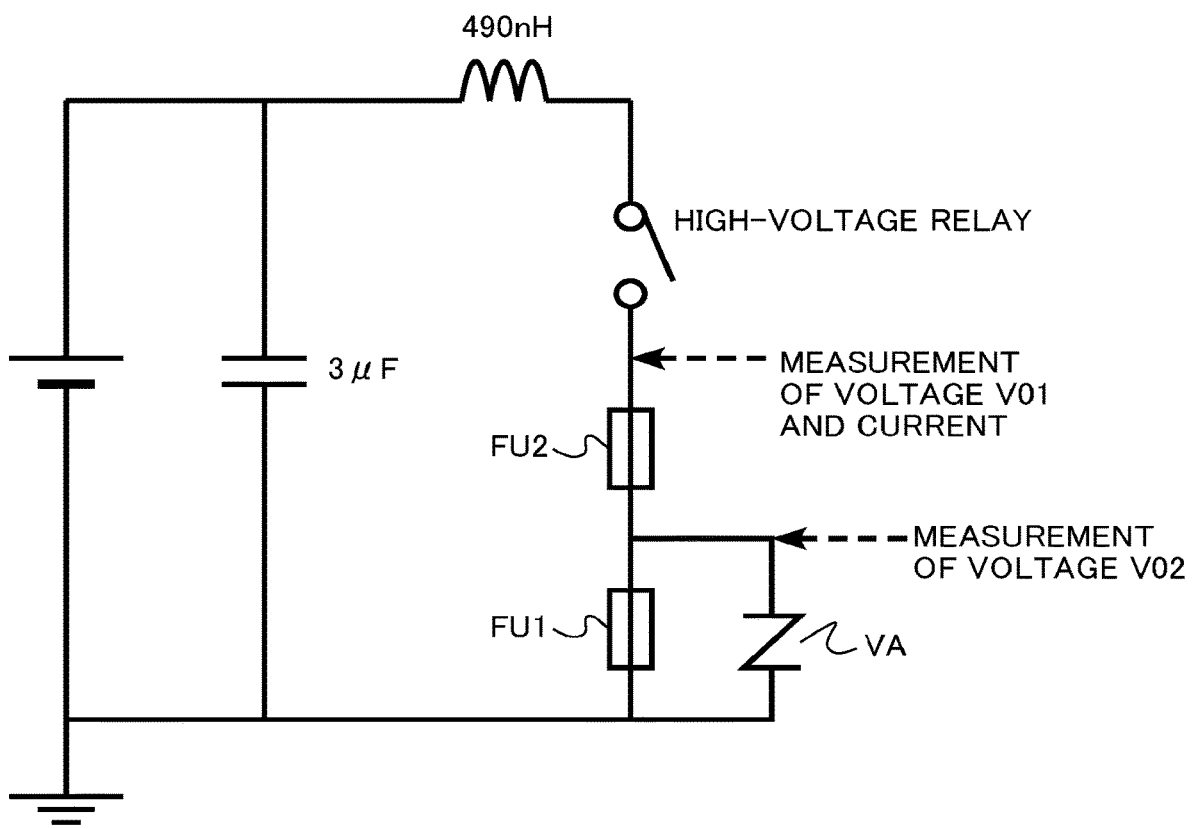
FIG. 16 is a diagram of an equivalent circuit of a test circuit in an example of experiment in the modification of the second embodiment.

FIG. 16 is a diagram of an equivalent circuit of a test circuit in an example of experiment in the modification of the second embodiment. The varistor VA is connected to a wire which extends from between the fuse FU1 and the fuse FU2 and leads to a ground. The circuit in FIG. 16 is a result of simulating an equivalent circuit of the power module 201 according to the modification of the second embodiment.

Figure 17:
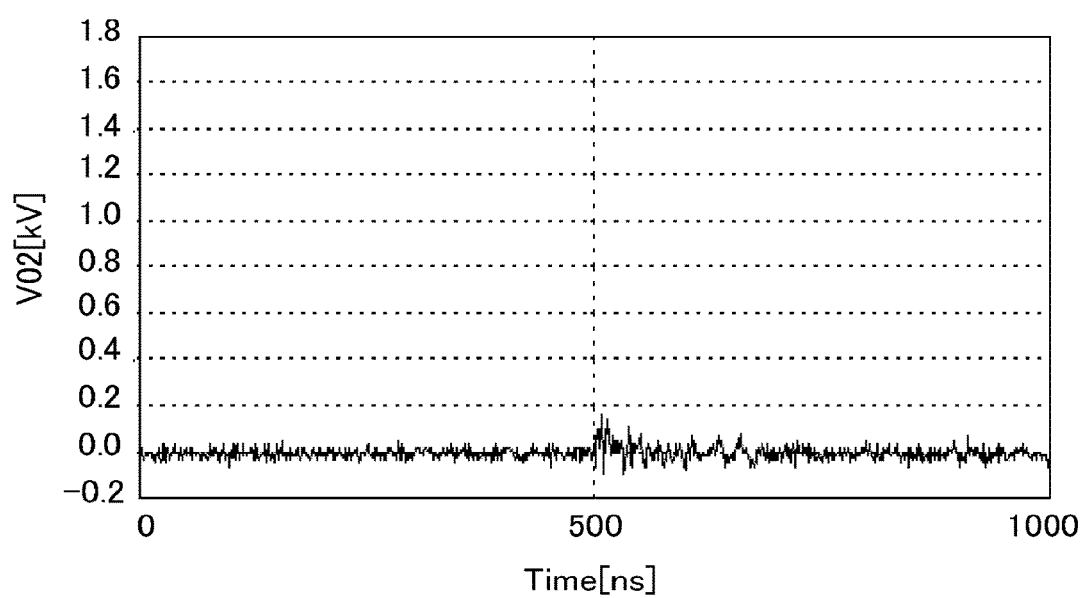
FIG. 17 is a view showing results of measurement in the example of experiment in the modification of the second embodiment.

FIG. 17 is a view showing results of measurement in an example of experiment in the modification of the second embodiment. FIG. 17 shows variation with time of the voltage V02.

A momentary increase of the voltage V02 like that seen in the circuit shown in FIG. 11 in which the varistor VA is not included is not observed. It is considered that a current flows to a ground by virtue of the varistor VA, so that an increase of a voltage is suppressed.

It is noted that the varistor VA keeps having high resistance until an applied voltage reaches a predetermined threshold voltage, and thus, a level of a gate voltage being applied to a gate electrode of a transistor during normal operation of the power module 201 is not affected.

As described above, with the semiconductor modules according to the second embodiment and the modification, like the semiconductor module according to the first embodiment, it is possible to provide a semiconductor module which can continue operating even in a case where one semiconductor switching element is short-circuited and fails during operation. Therefore, reliability of the power apparatus including the semiconductor module according to the second embodiment is improved. Particularly, a circuit or an element connected to a gate electrode of a short-circuited semiconductor switching element is prevented from being broken, so that reliability of the power apparatus including the semiconductor module is further improved.

Third Embodiment

A semiconductor module according to a third embodiment is different from that of the first embodiment in that a third semiconductor switching element which is electrically connected in parallel with a first semiconductor switching element, between a first external terminal and a second external terminal, and includes a third gate electrode is further included, a first fuse is electrically connected between the first external terminal and the third semiconductor switching element, and a second fuse is electrically connected between the second external terminal and the third semiconductor switching element. Below, description of details which are to be duplication of the first embodiment will be partly omitted.

Figure 18:
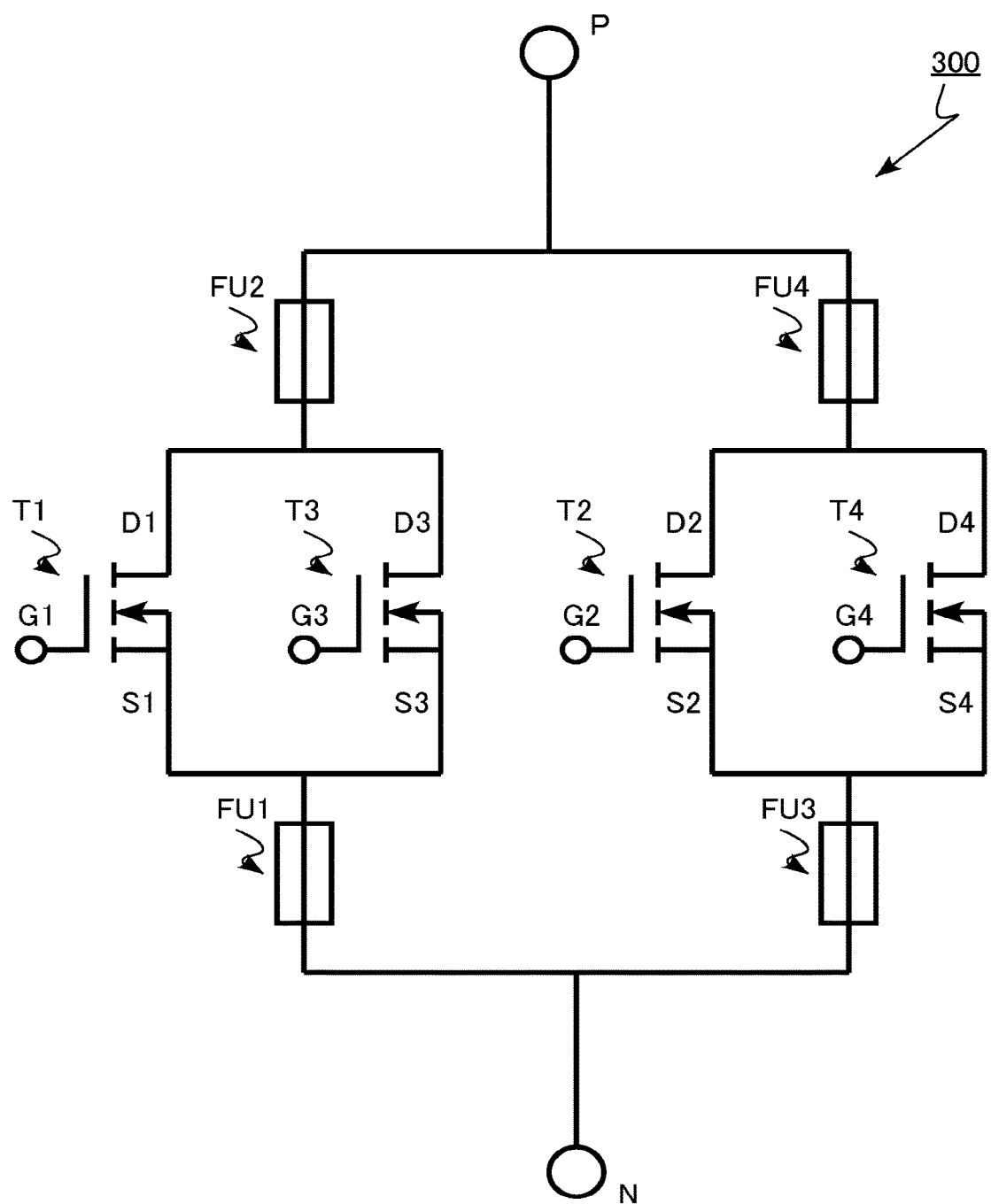
FIG. 18 is a diagram of an equivalent circuit of a semiconductor module according to a third embodiment.

FIG. 18 is a diagram of an equivalent circuit of the semiconductor module according to the third embodiment.

The semiconductor module according to the third embodiment is a power module 300 in which a plurality of power semiconductor elements are mounted in one package. The power module 300 is used for an inverter designed to control high power, or the like, for example. A rated voltage of the power module 300 is equal to or higher than 250 V and equal to or lower than 10 kV, for example.

In the power module 300, as shown in FIG. 18, a transistor T1 (first semiconductor switching element, i.e. a first semiconductor switch), a transistor T2 (second semiconductor switching element, i.e. a second semiconductor switch), a transistor T3 (third semiconductor switching element, i.e. a third semiconductor switch), and a transistor T4 (fourth semiconductor switching element, i.e. a fourth semiconductor switch) are connected in parallel between a negative-pole terminal N (first external terminal) and a positive-pole terminal P (second external terminal). Each of the transistor T1, the transistor T2, the transistor T3, and the transistor T4 is a MOSFET, for example.

The transistor T1 includes a source electrode S1, a drain electrode D1, and a gate electrode G1 (first gate electrode). The transistor T2 includes a source electrode S2, a drain electrode D2, and a gate electrode G2 (second gate electrode). The transistor T3 includes a source electrode S3, a drain electrode D3, and a gate electrode G3 (third gate electrode). The transistor T4 includes a source electrode S4, a drain electrode D4, and a gate electrode G4.

A fuse FU1 (first fuse) is electrically connected between the negative-pole terminal N and the transistor T1. The fuse FU1 (first fuse) is electrically connected between the negative-pole terminal N and the transistor T3. One end of the fuse FU1 is electrically connected to the negative-pole terminal N, and the other end is electrically connected to the source electrode S1 of the transistor T1 and the source electrode S3 of the transistor T3.

A fuse FU2 (second fuse) is electrically connected between the positive-pole terminal P and the transistor T1. The fuse FU2 (second fuse) is electrically connected between the positive-pole terminal P and the transistor T3. One end of the fuse FU2 is electrically connected to the positive-pole terminal P, and the other end is electrically connected to the drain electrode D1 of the transistor T1 and the drain electrode D3 of the transistor T3.

The transistor T1 and the transistor T3 are connected in parallel between the fuse FU1 and the fuse FU2.

A fuse FU3 (third fuse) is electrically connected between the negative-pole terminal N and the transistor T2. The fuse FU3 (third fuse) is electrically connected between the negative-pole terminal N and the transistor T4. One end of the fuse FU3 is electrically connected to the negative-pole terminal N, and the other end is electrically connected to the source electrode S2 of the transistor T2 and the source electrode S4 of the transistor T4.

A fuse FU4 (fourth fuse) is electrically connected between the positive-pole terminal P and the transistor T2. The fuse FU4 (fourth fuse) is electrically connected between the positive-pole terminal P and the transistor T4. One end of the fuse FU4 is electrically connected to the positive-pole terminal P, and the other end is electrically connected to the drain electrode D2 of the transistor T2 and the drain electrode D4 of the transistor T4.

The transistor T2 and the transistor T4 are connected in parallel between the fuse FU3 and the fuse FU4.

Figure 19:
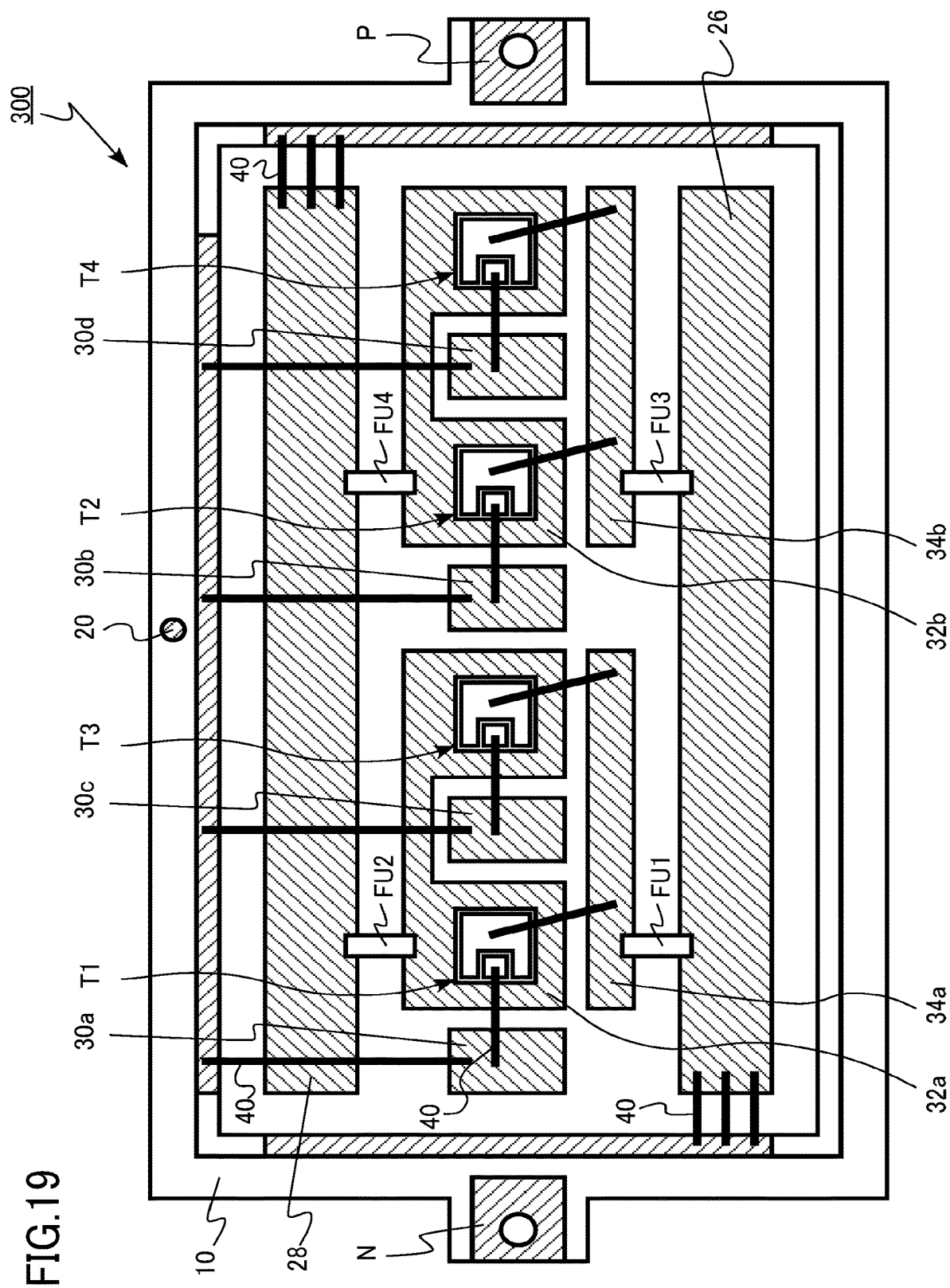
FIG. 19 is a schematic top view of the semiconductor module according to the third embodiment.

FIG. 19 is a schematic top view of the semiconductor module according to the third embodiment.

The power module 300 includes the negative-pole terminal N (first external terminal), the positive-pole terminal P (second external terminal), the transistor T1 (first semiconductor switching element, i.e. a first semiconductor switch), the transistor T2 (second semiconductor switching element, i.e. a second semiconductor switch), the transistor T3 (third semiconductor switching element, i.e. a third semiconductor switch), the transistor T4 (fourth semiconductor switching element, i.e. a fourth semiconductor switch), the fuse FU1 (first fuse), the fuse FU2 (second fuse), the fuse FU3 (third fuse), and the fuse FU4 (fourth fuse).

The power module 300 includes a resin case 10, a lid 12, a gate terminal 20, a metal substrate 22, a resin insulating layer 24, a source wiring metal layer 26, a drain wiring metal layer 28, gate wiring metal layers 30a to 30d, drain connection metal layers 32a and 32b, source connection metal layers 34a and 34b, a bonding wire 40, and a silicone gel 42 (sealing material).

The transistors T1 and T3 are provided on the drain connection metal layer 32a in common. The transistors T2 and T4 are provided on the drain connection metal layer 32b in common.

The source electrodes S1 and S3 are connected to the source connection metal layer 34a in common using the bonding wire 40. The source electrodes S2 and S4 are connected to the source connection metal layer 34b in common using the bonding wire 40.

In the power module 300, the transistor T1 and the transistor T3 share the fuse FU1 and the fuse FU2. Then, the transistor T2 and the transistor T4 share the fuse FU3 and the fuse FU4.

If the transistor T1 is short-circuited and fails, the fuse FU1 and the fuse FU2 are blown out. Also, if the transistor T3 is short-circuited and fails, the fuse FU1 and the fuse FU2 are blown out.

If the transistor T2 is short-circuited and fails, the fuse FU3 and the fuse FU4 are blown out. Also, if the transistor T4 is short-circuited and fails, the fuse FU3 and the fuse FU4 are blown out.

In the power module 300, two transistors share a fuse, so that the number of fuses in the power module 300 can be reduced. Accordingly, miniaturization of the power module 300 can be achieved.

As described above, with the semiconductor module according to the third embodiment, like the semiconductor module according to the first embodiment, it is possible to provide a semiconductor module which can continue operating even in a case where one semiconductor switching element is short-circuited and fails during operation. Therefore, reliability of the power apparatus including the semiconductor module according to the third embodiment is improved. Further, by reduction of the number of fuses, miniaturization of a semiconductor module can be achieved.

Though the first to third embodiments have been described while taking a case in which four semiconductor switching elements are provided, as an example, the number of semiconductor switching elements is not limited to four as long as a plurality of semiconductor switching elements are provided.

The first to third embodiments have been described while taking a case in which only a semiconductor switching element is included as a semiconductor element in a semiconductor module, as an example. However, the other semiconductor elements such as a diode, for example, may be included in a semiconductor module.

Though the first to third embodiments have been described while taking a case in which a semiconductor switching element is a MOSFET, as an example, the other semiconductor switching elements such as an IGBT may be applied as a semiconductor switching element.

Though the first to third embodiments have been described while taking a semiconductor module configured so as to include the resin case 10, as an example, a semiconductor module having a configuration in which a semiconductor switching element is formed by molding can be applied to the present disclosure, for example.

Though the first to third embodiments have been described while taking a case in which the silicone gel 42 is used a sealing material, as an example, the other resin materials such as an epoxy resin, for example, can be used in place of the silicone gel 42.

Though the second embodiment has been described while taking a case in which two Zener diodes are used as the overvoltage protection elements 90, as an example, either one Zener diode or three or more Zener diodes can be used.

While certain embodiments have been described, these embodiments have been presented by way of example only, and are not intended to limit the scope of the inventions. Indeed, the semiconductor module described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor module comprising:
a first external terminal;
a second external terminal;
a first semiconductor switch electrically connected between the first external terminal and the second external terminal, the first semiconductor switch including a first gate electrode;
a second semiconductor switch electrically connected in parallel with the first semiconductor switch between the first external terminal and the second external terminal, the second semiconductor switch including a second gate electrode;
a first fuse electrically connected between the first external terminal and the first semiconductor switch;
a second fuse electrically connected between the second external terminal and the first semiconductor switch; and
an overvoltage protection element electrically connected between either the first external terminal or the second external terminal and the first gate electrode, the overvoltage protection element including a varistor.

2. The semiconductor module according to claim 1, wherein
the first fuse includes a first insulating layer and a plurality of first linear conductors on the first insulating layer, and
the second fuse includes a second insulating layer and a plurality of second linear conductors on the second insulating layer.

3. The semiconductor module according to claim 2, wherein
a length of each of the first linear conductors and the second linear conductors is equal to or larger than 1 mm and equal to or smaller than 10 mm.

4. The semiconductor module according to claim 2, wherein
a thickness of each of the first linear conductors and the second linear conductors is equal to or larger than 0.1 μm and equal to or smaller than 1.3 μm, and
a difference in the thickness between each of the first linear conductors and each of the second linear conductors is equal to or smaller than 0.3 μm.

5. The semiconductor module according to claim 2, wherein
each of the first linear conductors and the second linear conductors includes aluminum.

6. The semiconductor module according to claim 1, further comprising:
a third fuse electrically connected between the first external terminal and the second semiconductor switch; and
a fourth fuse electrically connected between the second external terminal and the second semiconductor switch.

7. The semiconductor module according to claim 1 further comprising
a third semiconductor switch electrically connected in parallel with the first semiconductor switch between the first external terminal and the second external terminal, the third semiconductor switch including a third gate electrode, wherein
the first fuse is electrically connected between the first external terminal and the third semiconductor switch, and
the second fuse is electrically connected between the second external terminal and the third semiconductor switch.

8. The semiconductor module according to claim 1 further comprising
a sealing material with which the first semiconductor switch, the second semiconductor switch, the first fuse, and the second fuse are covered.

9. The semiconductor module according to claim 3, wherein
a thickness of each of the first linear conductors and the second linear conductors is equal to or larger than 0.1 μm and equal to or smaller than 1.3 μm, and
a difference in the thickness between each of the first linear conductors and each of the second linear conductors is equal to or smaller than 0.3 μm.

10. The semiconductor module according to claim 3, wherein
each of the first linear conductors and the second linear conductors includes aluminum.

11. The semiconductor module according to claim 4, wherein
each of the first linear conductors and the second linear conductors includes aluminum.

* * * * *